(12) United States Patent
Ogawa et al.

(10) Patent No.: US 9,839,135 B2
(45) Date of Patent: Dec. 5, 2017

(54) METHOD OF PRODUCING ELECTRONIC COMPONENTS AND METHOD OF PRODUCING SUBSTRATE-TYPE TERMINALS

(71) Applicant: Murata Manufacturing Co., Ltd., Nagaokakyo-shi, Kyoto-fu (JP)

(72) Inventors: Kazuto Ogawa, Nagaokakyo (JP); Takashi Watanabe, Nagaokakyo (JP); Junya Shimakawa, Nagaokakyo (JP); Mitsuhide Kato, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 435 days.

(21) Appl. No.: 14/332,652

(22) Filed: Jul. 16, 2014

(65) Prior Publication Data
US 2015/0026972 A1    Jan. 29, 2015

(30) Foreign Application Priority Data
Jul. 23, 2013    (JP) ................. 2013-152806

(51) Int. Cl.
*H05K 3/00* (2006.01)
*H01G 2/06* (2006.01)
(Continued)

(52) U.S. Cl.
CPC ........... *H05K 3/0052* (2013.01); *H01G 2/065* (2013.01); *H05K 1/141* (2013.01); *H05K 3/3442* (2013.01);
(Continued)

(58) Field of Classification Search
CPC ..... H05K 3/0052; H05K 3/3442; H01G 2/065
See application file for complete search history.

(56) References Cited

U.S. PATENT DOCUMENTS

2003/0232489 A1* 12/2003 Mizutani ............. H05K 3/0052
438/460
2004/0001325 A1* 1/2004 Wang .................. H05K 3/0052
361/762
(Continued)

FOREIGN PATENT DOCUMENTS

CN        101989495 A    3/2011
JP         7-111380 A    4/1995
(Continued)

OTHER PUBLICATIONS

Official Communication issued in corresponding Japanese Patent Application No. 2013-152806, dated May 7, 2015.

*Primary Examiner* — Peter DungBa Vo
*Assistant Examiner* — Jeffrey T Carley
(74) *Attorney, Agent, or Firm* — Keating & Bennett, LLP

(57) ABSTRACT

A method of producing electronic components each including a substrate-type terminal and a device connected to the substrate-type terminal including a substrate body with first and second principal surfaces opposite to each other and an electrode configured to be connected to the device on the first principal surface, wherein the device is disposed on the first principal surface, includes forming grooves in a substrate from one of the first and second principal surfaces of the substrate such that the substrate is divided into the substrate-type terminals, the grooves each having a depth less than a thickness of the substrate, cutting the substrate from another principal surface opposite to the principal surface of the substrate body such that the grooves penetrate through the substrate in a thickness direction thereof, and mounting the device on each of the first principal surfaces.

7 Claims, 16 Drawing Sheets

(51) Int. Cl.
*H05K 1/14* (2006.01)
*H05K 3/34* (2006.01)

(52) U.S. Cl.
CPC .................. *H05K 2201/049* (2013.01); *H05K 2201/0909* (2013.01); *H05K 2201/09181* (2013.01); *H05K 2201/09645* (2013.01); *H05K 2201/10636* (2013.01); *H05K 2203/0191* (2013.01); *H05K 2203/1563* (2013.01); *Y02P 70/611* (2015.11); *Y10T 29/4913* (2015.01)

(56) References Cited

U.S. PATENT DOCUMENTS

| | | |
|---|---|---|
| 2011/0024175 A1 | 2/2011 | Satou |
| 2012/0326334 A1 | 12/2012 | Sakaguchi |
| 2013/0037911 A1* | 2/2013 | Hattori .................. H01L 28/40 257/532 |
| 2014/0124256 A1 | 5/2014 | Hattori et al. |

FOREIGN PATENT DOCUMENTS

| | | |
|---|---|---|
| JP | 2011-159679 A | 8/2011 |
| JP | 2013-4881 A | 1/2013 |
| JP | 2013-038291 A | 2/2013 |
| WO | 2012/090986 A1 | 7/2012 |
| WO | 2013/008550 A1 | 1/2013 |

* cited by examiner

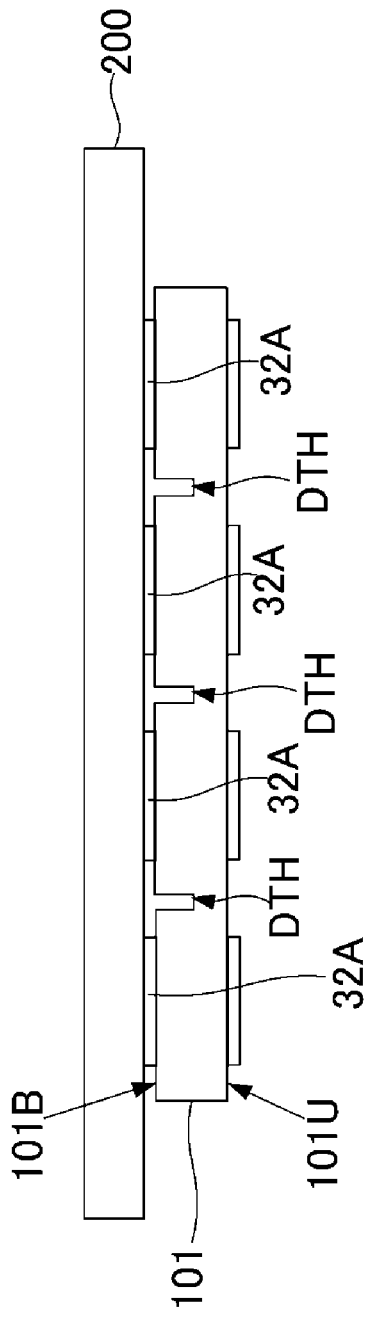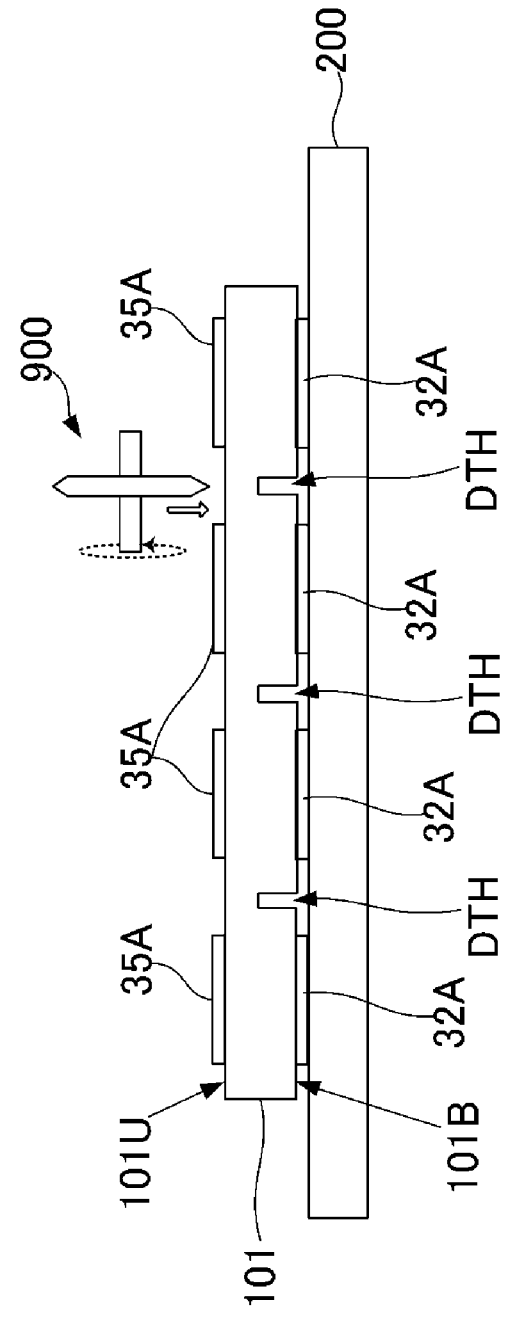

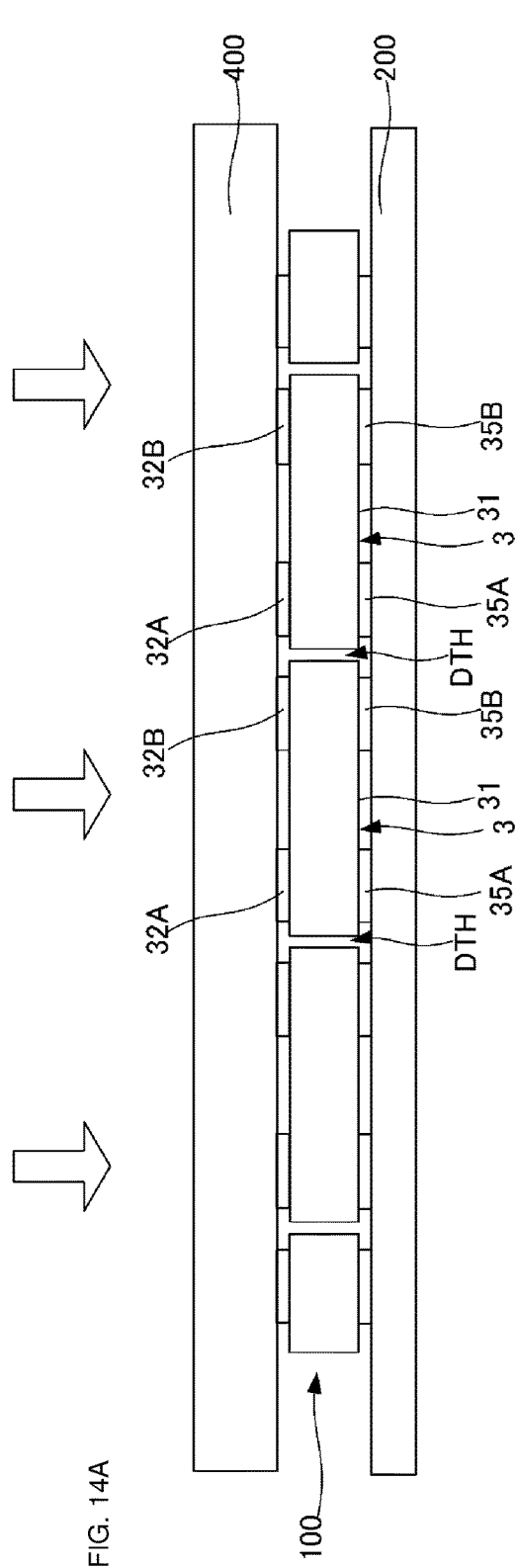
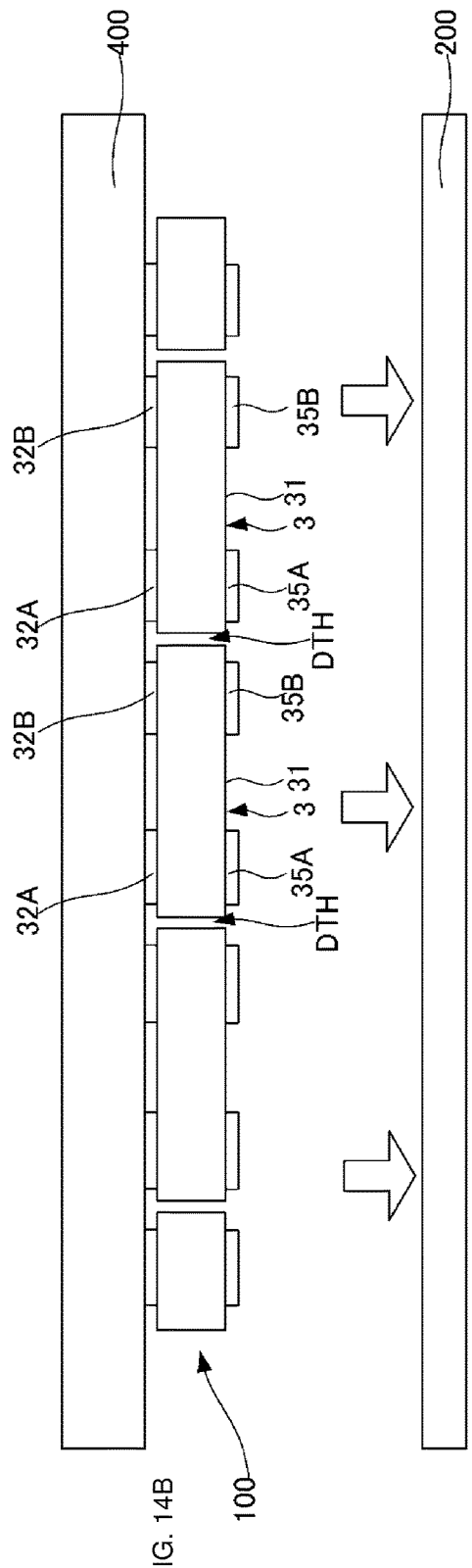

METHOD OF PRODUCING ELECTRONIC COMPONENTS AND METHOD OF PRODUCING SUBSTRATE-TYPE TERMINALS

BACKGROUND OF THE INVENTION

1. Field of the Invention

The present invention relates to a method of producing electronic components each including a substrate-type terminal and a device mounted on the substrate-type terminal and to a method of producing substrate-type terminals on which devices are to be mounted.

2. Description of the Related Art

There is a known technique of implementing a device on a circuit board using a substrate-type terminal disposed therebetween to connect the device and a land electrode on the circuit board by wiring or to prevent vibrations of the device from being transmitted to the circuit board (see, for example, Japanese Unexamined Patent Application Publication No. 2013-38291).

Japanese Unexamined Patent Application Publication No. 2013-38291 describes implementing a multilayer ceramic capacitor on an insulating substrate with a conductive pattern formed thereon, cutting the insulating layer, and thereby extracting a chip component structure including the multilayer ceramic capacitor (device) and a substrate-type terminal.

In the method of producing the chip component structure described in Japanese Unexamined Patent Application Publication No. 2013-38291, the occurrence of burrs in cutting the insulating substrate can be prevented by the application of a green resist on the conductive pattern before the insulating substrate is cut.

However, in the method of producing the chip component structure described in Japanese Unexamined Patent Application Publication No. 2013-38291, the multilayer ceramic capacitor may be partly mounted on the insulating substrate through the green resist. In other words, part of the multilayer ceramic capacitor may ride on the green resist.

In that case, the multilayer ceramic capacitor is displaced from the location where it is to be implemented. In addition, if the multilayer ceramic capacitor and the conductive pattern are joined together by melting a solder bonding agent in a state where the multilayer ceramic capacitor rides on the green resist, the multilayer ceramic capacitor may be further displaced from the location where it is to be implemented.

SUMMARY OF THE INVENTION

Accordingly, preferred embodiments of the present invention provide a method of producing electronic components, the method being capable of preventing burrs occurring in cutting a substrate that is to become substrate-type terminals, and a method of producing substrate-type terminals on which devices are to be mounted.

According to a preferred embodiment of the present invention, a method of producing electronic components each including a substrate-type terminal and a device connected to the substrate-type terminal is provided. The substrate-type terminal includes a substrate body including a first principal surface and a second principal surface opposite to each other and includes an electrode configured to be connected to the device on the first principal surface. Each of the first and second principal surfaces has a rectangular or substantially rectangular shape extending in first and second directions perpendicular or substantially perpendicular to each other. The device is disposed on the first principal surface.

The method of producing electronic components includes a groove forming step of forming grooves in a substrate from a principal surface of the substrate such that the substrate is divided into the plurality of substrate-type terminals, the principal surface of the substrate being the first principal surface or the second principal surface of the substrate body, each of the grooves having a depth less than a thickness of the substrate, a cutting step of cutting the substrate from another principal surface opposite to the principal surface of the substrate such that the grooves penetrate through the substrate in a thickness direction thereof, and a mounting step of mounting the device on the first principal surface of the substrate body of each of the substrate-type terminals obtained by the cutting step.

An example of the device may be a multilayer ceramic capacitor. Other electronic components may also be used. The device is implemented on the substrate-type terminal through the electrode configured to be connected to the device.

The groove forming step may be performed by dicer processing or pressing and cutting using a cutter blade. That is, grooves are formed in the substrate by being pressed from the principal surface to the other principal surface in the groove forming step. When the conductive pattern on the principal surface is cut in forming each of the grooves, a burr occurs inward in the depth direction (direction from the principal surface to the other principal surface) of the groove.

The grooves do not extend through the substrate from the principal surface to the other principal surface. Accordingly, even if a burr occurs inward in the substrate, the burr does not protrude through the other principal surface toward the outside of the substrate.

In the cutting step, the substrate is cut from the other principal surface such that each of the grooves penetrates through the substrate in the thickness direction. That is, the cutting is conducted at the location of the groove as seen from the normal direction of the principal surface of the substrate. Thus, the cutting of the substrate is completed when it reaches the groove. Even if an electrode disposed on the other principal surface is cut, because of errors in processing accuracy or the like, a burr ends inside the substrate, and thus it does not protrude through the other principal surface to the outside of the substrate.

As described above, in the method of producing the electronic components, because the substrate is cut from both sides, even if an electrode is cut, a burr does not protrude to the outside of the substrate. Accordingly, with the above-described producing method, because no resist for preventing the occurrence of burrs is applied to an electrode, the device is not displaced by a green resist.

In the cutting step, a first support member may be attached on the principal surface of the substrate, the substrate may be supported using the first support member, the surface of the substrate may be inverted, and the substrate may be cut from the other principal surface of the substrate.

Because the substrate is supported by the plane of the first support member, the substrate does not easily splinter.

In the cutting step, the substrate may be cut such that the substrate-type terminals adjacent in the first direction are spaced apart at first predetermined intervals, and each of the first predetermined intervals may be less than each of intervals of the devices adjacent in the first direction mounted on the substrate-type terminals.

In the cutting step, the substrate may be cut such that the substrate-type terminals adjacent in the second direction are spaced apart at second predetermined intervals, and each of the second predetermined intervals may be less than each of intervals of the devices adjacent in the second direction mounted on the substrate-type terminals.

When the substrate is cut in the above-described way, the substrate-type terminal is smaller than the device as seen from the normal direction of the first principal surface of the substrate body. Accordingly, the substrate-type terminal is less susceptible to external impact. As a result, with this method of producing the electronic components, the multilayer capacitor is prevented from being detached from the substrate-type terminal by receiving impact.

Each of the grooves may extend between the plurality of electrodes configured to be connected to the device spaced apart in the first direction on the principal surface or may extend between the plurality of electrodes for external connection spaced apart in the first direction on the other principal surface.

Each of the grooves may extend between two connection electrodes on a side wall defined by a cylindrical or substantially cylindrical indentation extending through the substrate from the electrodes configured to be connected to the devices on the first principal surface to electrodes for external connection on the second principal surface, the two connection electrodes connecting the electrodes configured to be connected to the devices and the electrodes for external connection at two locations spaced apart in the second direction.

When the grooves are formed in the above-described way, the forming of the grooves and the cutting of the substrate are performed while avoiding the electrodes configured to be connected to the devices, electrodes for external connection, and connection electrodes. Accordingly, the occurrence of burrs caused by cutting electrodes is reliably prevented.

The mounting step may include an applying step of applying a solder bonding agent containing tin and a heating step of heating the devices and the substrate-type terminals and melting the solder bonding agent. The method may further include a transferring step of transferring the plurality of substrate-type terminals from the first support member to a second support member while maintaining arrangement of the plurality of substrate-type terminals, the transferring step being performed between the cutting step and the mounting step.

The second support member is not used in the cutting step, and it is not damaged by the cutting step. Accordingly, the second support member is reusable, and this producing method is economical.

The preferred embodiments of the present invention are not limited to the method of producing electronic components each including a device mounted thereon and may include a method of producing substrate-type terminals on which devices are to be mounted.

The above-mentioned method of producing electronic components and method of producing substrate-type terminals reliably prevents burrs from occurring in cutting a substrate and eliminates the need to apply a green resist on an electrode.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 9A is a side view of the insulating substrate with an adhesive sheet attached on the back side, and FIG. 9B is a side view of the insulating substrate inverted and cut from its front side.

FIG. 14A is a side view of the assembly with a heat-resistant adhesive plate attached on the back side, and 14B is a side view of the assembly and the adhesive sheet removed from the front side.

DETAILED DESCRIPTION OF THE PREFERRED EMBODIMENTS

First Preferred Embodiment

Figure 1A:
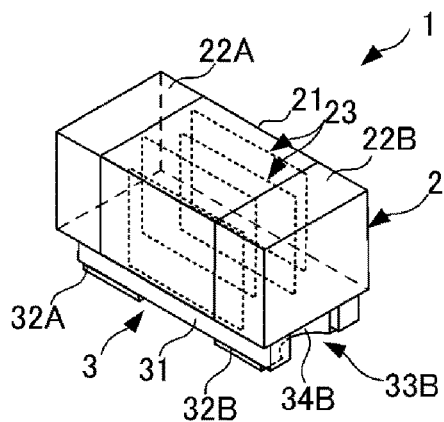
FIG. 1A is an external perspective view of an electronic component produced by a method of producing electronic components according to a first preferred embodiment of the present invention.
Figure 1B:
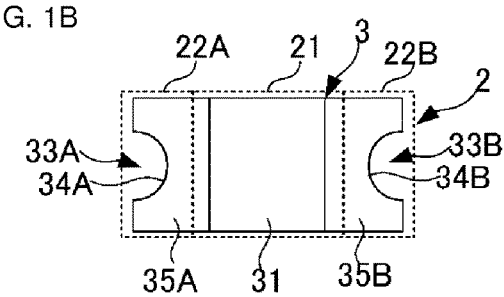
FIG. 1B is a plan view of the electronic component.
Figure 1D:
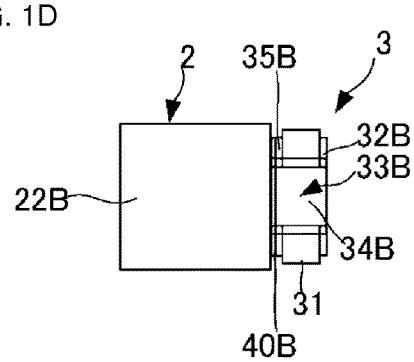
FIG. 1D is a right side view of the electronic component.
Figure 1C:
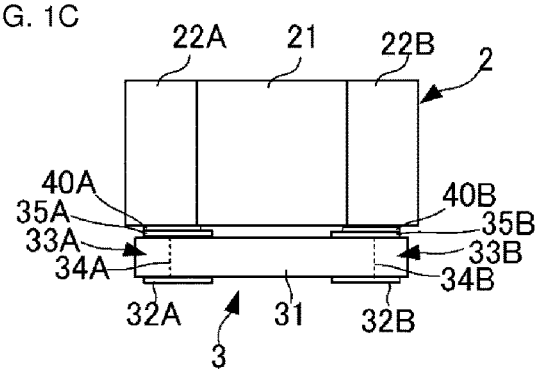
FIG. 1C is a front view of the electronic component.
Figure 1F:
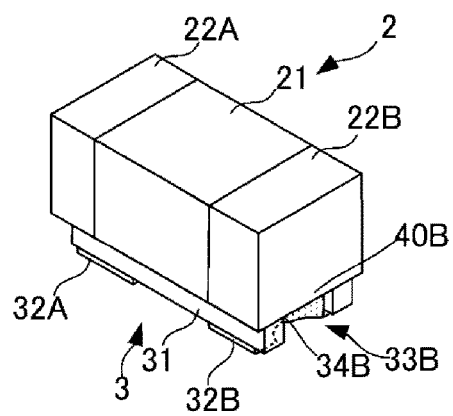
FIG. 1F is an external perspective view of the electronic component and illustrates wetting-up of a solder bonding agent.
Figure 1E:
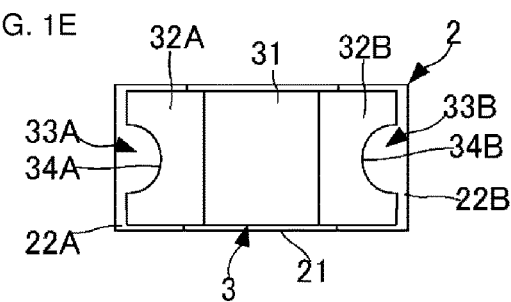
FIG. 1E is a bottom view of the electronic component.

An electronic component 1 produced by a method of producing electronic components according to a first preferred embodiment of the present invention is first described with reference to FIGS. 1A to 1E. FIG. 1A is an external perspective view of the electronic component 1. FIG. 1B is a plan view of the electronic component 1. FIG. 1C is a front view of the electronic component 1. FIG. 1D is a right side view of the electronic component 1. FIG. 1E is a bottom view of the electronic component 1. FIG. 1F is an external perspective view of the electronic component 1 and illustrates wetting-up of a solder bonding agent.

As illustrated in FIG. 1A, the electronic component 1 includes a multilayer capacitor 2 and a substrate-type terminal 3.

The multilayer capacitor 2 is a so-called multilayer ceramic capacitor and includes a multilayer body 21, outer electrodes 22A and 22B, and a plurality of inner electrodes 23. The multilayer capacitor 2 is any structure in which a plurality of dielectric layers are stacked. The multilayer capacitor 2 may also be a multilayer metallized film capacitor in which a resin film is used as the dielectric material.

The multilayer body 21 has a rectangular or substantially rectangular parallelepiped shape and includes a first end surface (left side surface in FIG. 1A) and a second end surface (right side surface in FIG. 1A) as opposite end surfaces in the longitudinal direction. The first and second end surfaces are square or substantially square. The multilayer body 21 is the one in which a plurality of ceramic dielectric layers are laterally stacked. The multilayer body 21 also includes first and second principal surfaces and first and second side surfaces. The first and second principal surfaces are perpendicular or substantially perpendicular to the stacking direction and connected to the first and second end surfaces. The first and second side surfaces are parallel or substantially parallel to the stacking direction. The plurality of inner electrodes 23 are stacked inside the multilayer body 21 such that a dielectric layer is disposed therebetween. The first and second end surfaces of the multilayer body 21 may not be square or substantially square and may be rectangular or substantially rectangular. For example, the first and second end surfaces may be shorter in the stacking direction.

The outer electrode 22A is disposed on the first end surface (left side surface in FIG. 1A) of the multilayer body 21 and partly extends to the four surfaces connected to the first end surface of the multilayer body 21 (first and second principal surfaces and first and second side surfaces). The outer electrode 22B is disposed on the second end surface (right side surface in FIG. 1A) of the multilayer body 21 and partly extends to the four surfaces connected to the second end surface of the multilayer body 21 (first and second principal surfaces and first and second side surfaces). The outer electrodes 22A and 22B are preferably disposed on at least one of the surfaces of the multilayer body 21.

Predetermined metallic plating may be applied on the outer electrodes 22A and 22B in order to protect them from corrosion or ensure conductivity. The multilayer capacitor 2 may have popular outer dimensions. Examples of the longitudinal dimension×lateral dimension of the multilayer capacitor 2 may include approximately 3.2 mm×1.6 mm, 2.0 mm×1.25 mm, 1.6 mm×0.8 mm, 1.0 mm×0.5 mm, 0.8 mm×0.4 mm, and 0.6 mm×0.3 mm, for example.

The electronic component 1 has the configuration in which the above-described multilayer capacitor 2 is mounted on an implementing surface of the substrate-type terminal 3. The bottom surface of the multilayer capacitor 2 mounted on the substrate-type terminal 3 facing the implementing surface of the substrate-type terminal 3 may be any one of the first and second principal surfaces and the first and second side surfaces. When the first principal surface or second principal surface of the multilayer capacitor 2 is the bottom surface facing the substrate-type terminal 3, as illustrated in FIG. 1A, the plane direction of each of the inner electrodes 23 is perpendicular or substantially perpendicular to the implementing surface of the substrate-type terminal 3. When the first side surface or second side surface of the multilayer capacitor 2 is the bottom surface facing the substrate-type terminal 3, the plane direction of the inner electrode 23 is parallel or substantially parallel with the implementing surface of the substrate-type terminal 3.

The substrate-type terminal 3 includes a substrate body 31, electrodes 35A and 35B configured to be connected to the device, electrodes 32A and 32B for external connection, and indentations 33A and 33B. The substrate body 31 has a rectangular or substantially rectangular parallelepiped shape whose thickness in a substrate normal direction perpendicular or substantially perpendicular to the implementing surface preferably is in the range of about 0.05 mm to about 0.4 mm, for example. The substrate body 31 includes a first principal surface perpendicular or substantially perpendicular to the substrate normal direction and a second principal surface opposite to the first principal surface. The multilayer capacitor 2 is mounted on the first principal surface of the substrate body 31. That is, the first principal surface of the substrate body 31 is the implementing surface of the substrate-type terminal 3. The electrodes 35A and 35B configured to be connected to the device are disposed on the first principal surface of the substrate body 31. The electrodes 32A and 32B for external connection are disposed on the second principal surface of the substrate body 31.

The substrate body 31 includes first and second end surfaces perpendicular or substantially perpendicular to the first and second principal surfaces of the substrate body 31 and extending along the lateral direction of the substrate body 31. The substrate body 31 includes first and second side surfaces perpendicular or substantially perpendicular to the first and second principal surfaces of the substrate body 31 and extending along the longitudinal direction of the substrate body 31. The substrate body 31 is rectangular or substantially rectangular as seen from the substrate normal direction. Here, the plane shape of the substrate body 31 is slightly smaller than that of the multilayer capacitor 2. For example, the plane dimensions of the substrate body 31 may be about 0.9 times those of the multilayer capacitor 2. For the outer dimensions of the substrate body 31, in consideration of attitude stability of the electronic component 1, the longitudinal dimension of the substrate body 31 may preferably be about 0.8 times or more longitudinal dimension (L) of the multilayer capacitor 2 and may more preferably be about 0.9 times or more, for example. The lateral dimension of the substrate body 31 may preferably be about 0.8 times or more lateral dimension (W) of the multilayer capacitor 2 and may more preferably be about 0.9 times or more, for example.

The indentations 33A and 33B are provided in the first and second end surfaces of the substrate body 31, respectively. The indentations 33A and 33B extend from the first principal surface to the second principal surface through the substrate body 31. The indentations 33A and 33B are semicircular or substantially semicircular as seen from the normal direction of the substrate body 31. The indentation 33A may extend from the first end surface to the first side surface or the second side surface. The indentation 33B may extend from the second end surface to the first side surface or the second side surface. The indentations 33A and 33B may not be semicircular or substantially semicircular as seen from the normal direction of the first principal surface of the substrate body 31.

The electrodes 35A and 35B configured to be connected to the device are arranged along the longitudinal direction on the first principal surface of the substrate body 31. The electrode 35A configured to be connected to the device is disposed on the first principal surface and near the first end surface of the substrate body 31. The electrode 35A configured to be connected to the device has a cut defined by the semicircular or substantially semicircular indentation 33A in the portion near the first end surface. The electrode 35B configured to be connected to the device is disposed on the first principal surface and near the second end surface of the substrate body 31. The electrode 35B configured to be connected to the device has a cut defined by the semicircular or substantially semicircular indentation 33B in the portion near the second end surface. These electrodes 35A and 35B configured to be connected to the device are electrically and mechanically joined to the outer electrodes 22A and 22B of the multilayer capacitor 2 with solder portions 40A and 40B disposed therebetween.

In the substrate body 31, each of the electrodes 35A and 35B configured to be connected to the device preferably is spaced apart by about 30 μm, for example, from the corresponding side surface (surface opposite to the implementing surface and in which the indentation 33A or 33B is formed) as seen from the normal direction of the first principal surface. As the distance between each of the electrodes 35A and 35B configured to be connected to the device and the corresponding side surface of the substrate body 31 becomes shorter, the area of the electrodes 35A and 35B configured to be connected to the device on the first principal surface of the substrate body 31 becomes larger. Thus, when the distance between each of the electrodes 35A and 35B configured to be connected to the device and the corresponding side surface of the substrate body 31 is reduced, even if the area of the first principal surface of the substrate body 31 is reduced, that is, even if the implementing are of the substrate-type terminal 3 is reduced, the mounting of the multilayer capacitor 2 is stabilized. The distance between each of the electrodes 35A and 35B configured to be connected to the device and the corresponding side surface of the substrate body 31 may preferably be about 50 μm or less, for example. The electrodes 35A and 35B configured to be connected to the device may be flush with the side surfaces of the substrate body 31.

The electrodes 32A and 32B for external connection are arranged along the longitudinal direction on the second principal surface of the substrate body 31. The electrode 32A for external connection is disposed on the second principal surface and near the first end surface of the substrate body 31. The electrode 32A for external connection has a cut defined by the semicircular or substantially semicircular indentation 33A in the portion near the first end surface. The electrode 32B for external connection is disposed on the second principal surface and near the second end surface of the substrate body 31. The electrode 32B for external connection has a cut defined by the semicircular or substantially semicircular indentation 33B in the portion near the second end surface. The shape of each of the electrodes 32A and 32B for external connection may be set in accordance with a mounting land of a circuit board on which the electronic component 1 is to be implemented.

Connection electrodes 34A and 34B are disposed on a portion of the side wall of the indentations 33A and 33B in the substrate body 31. The connection electrode 34A is positioned inward from the first end surface of the substrate body 31 as seen from the normal direction of the first principal surface of the substrate body 31. The connection electrode 34B is positioned inward from the second end surface of the substrate body 31 as seen from the normal direction of the first principal surface of the substrate body 31. The connection electrode 34A enables conduction between the electrode 35A configured to be connected to the device and the electrode 32A for external connection. The connection electrode 34B enables conduction between the electrode 35B configured to be connected to the device and the electrode 32B for external connection.

With the above-described shape, as illustrated in FIG. 1F, because solder flows into the indentations 33A and 33B, even if the amount of the applied solder is excessive, the solder portions 40A and 40B do not easily wet up the outer electrodes 22A and 22B in the stacking direction of the multilayer capacitor 2. Thus, even if the multilayer capacitor 2 is vibrated by a voltage applied thereon, the vibration is not easily transmitted to a circuit board connected to the electrodes 32A and 32B for external connection, and acoustic noise does not easily occur from the circuit board.

Figure 2:
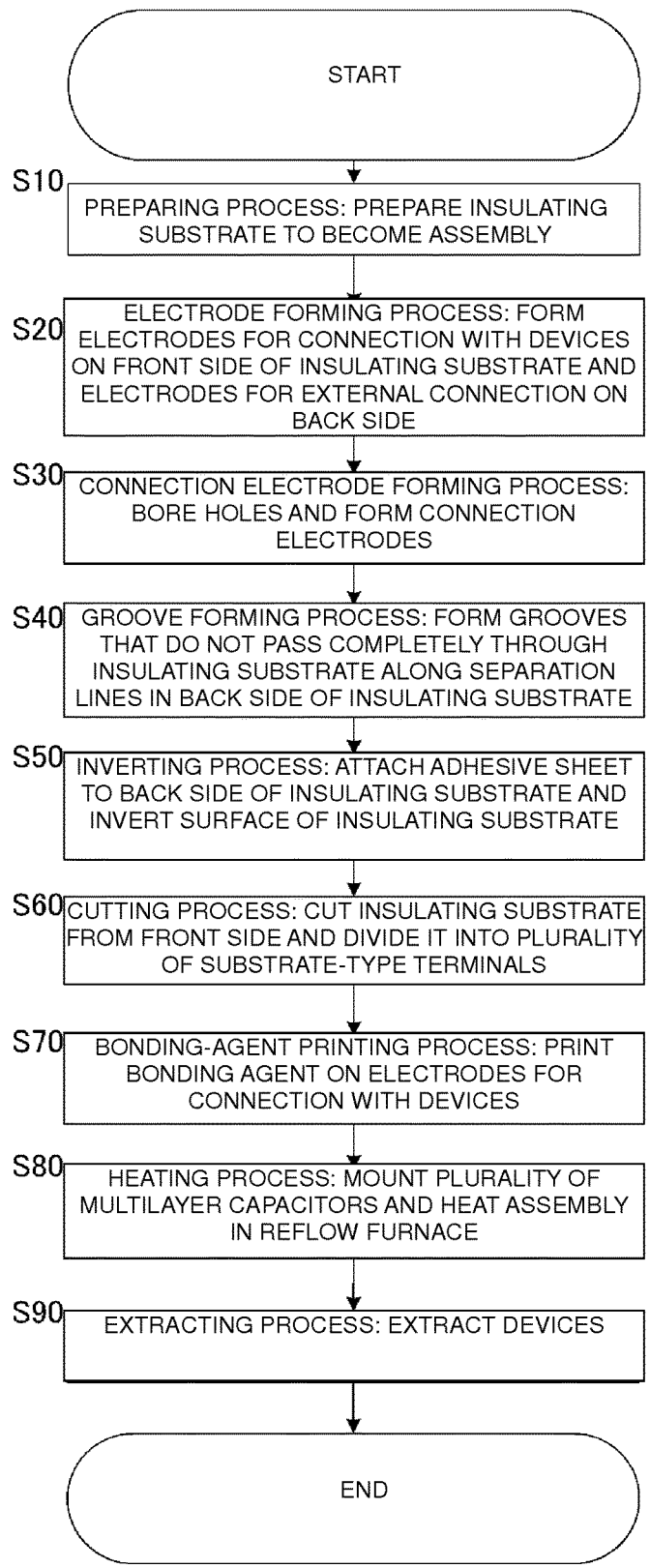
FIG. 2 is a flowchart that illustrates processes in the method of producing electronic components according to the first preferred embodiment of the present invention.
Figure 3:
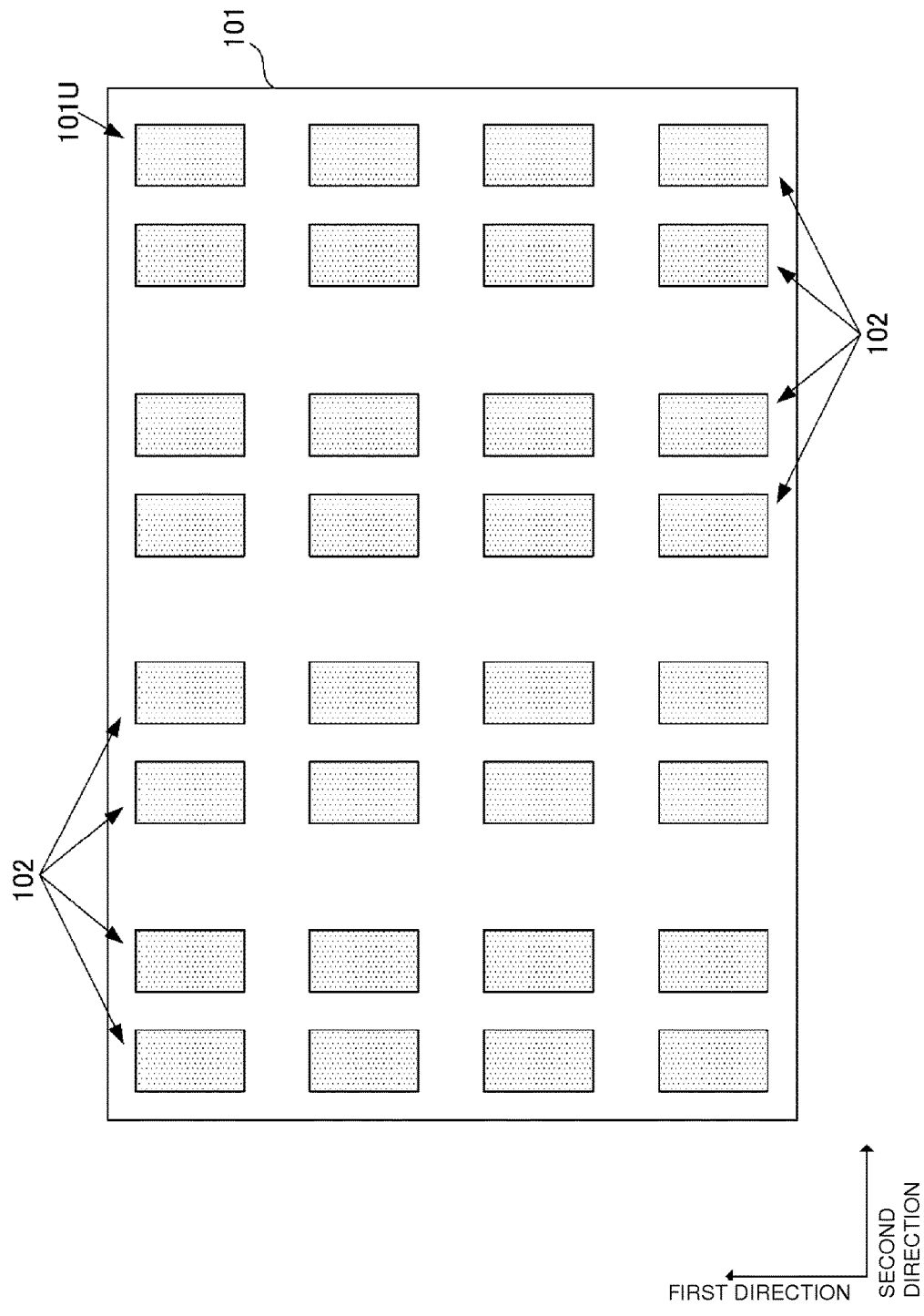
FIG. 3 is a plan view of an insulating substrate with a plurality of electrodes disposed thereon.
Figure 4:
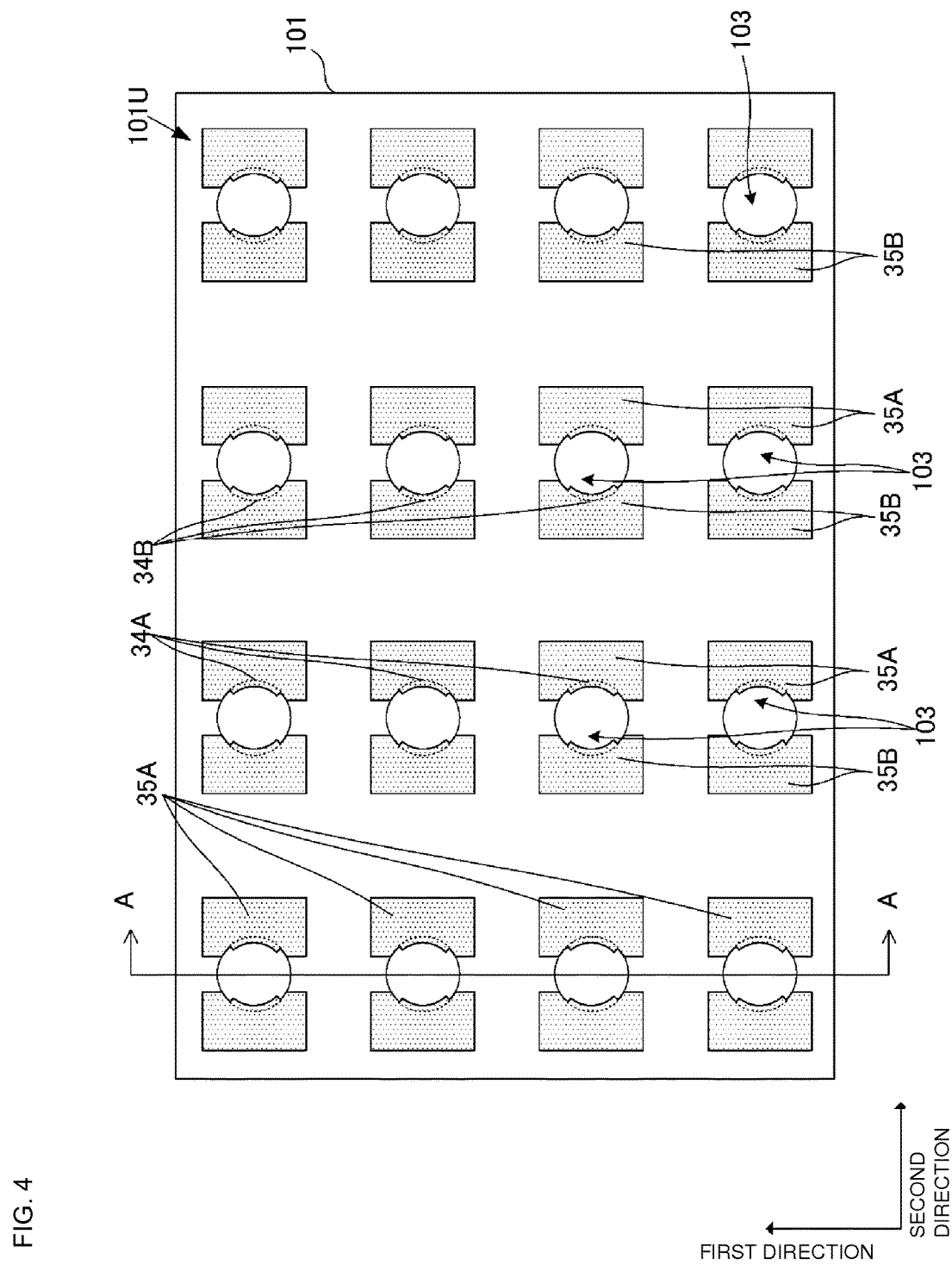
FIG. 4 is a plan view of the insulating substrate with a plurality of holes disposed therein.
Figure 5:
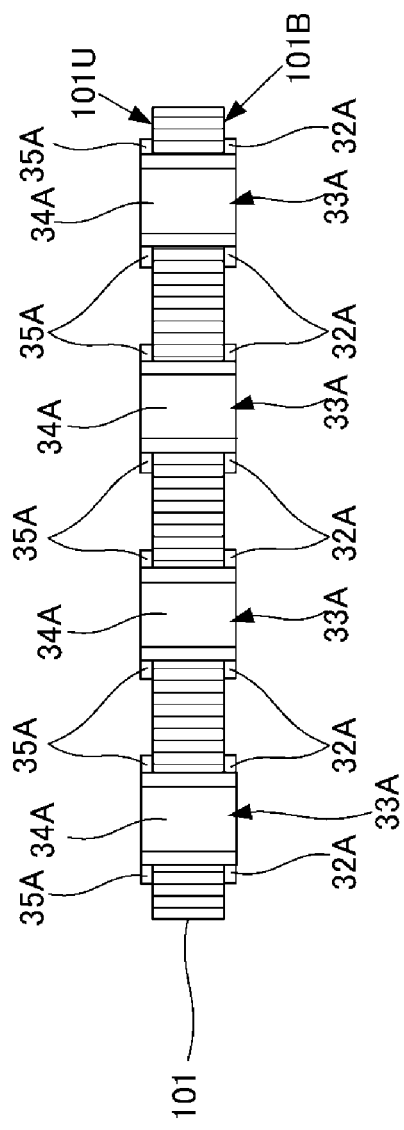
FIG. 5 is a cross-sectional view taken along the line A-A in FIG. 4 and illustrates the insulating substrate with a plurality of connection electrodes disposed thereon.
Figure 6:
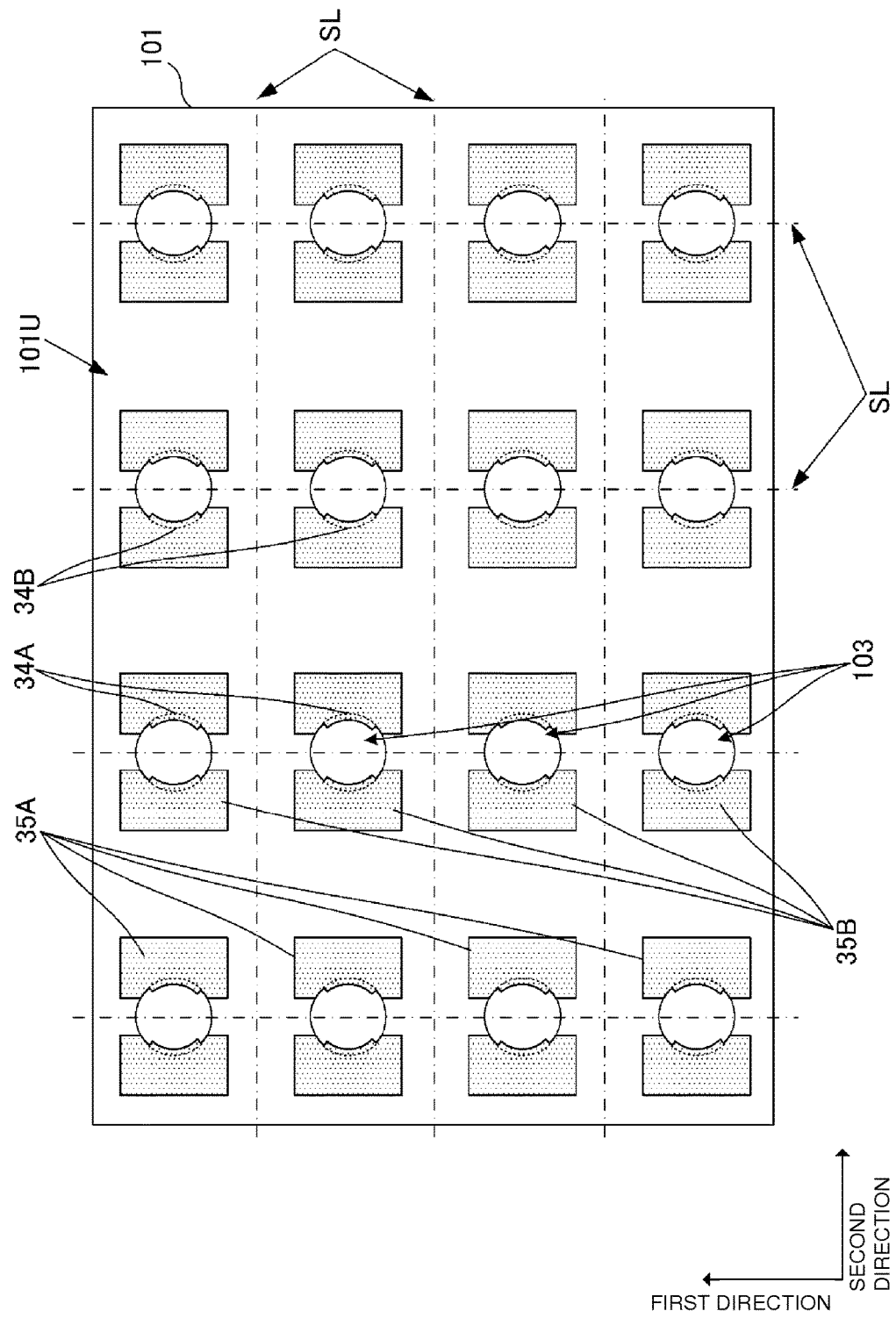
FIG. 6 is a plan view of the insulating substrate for describing separation lines.
Figure 7:
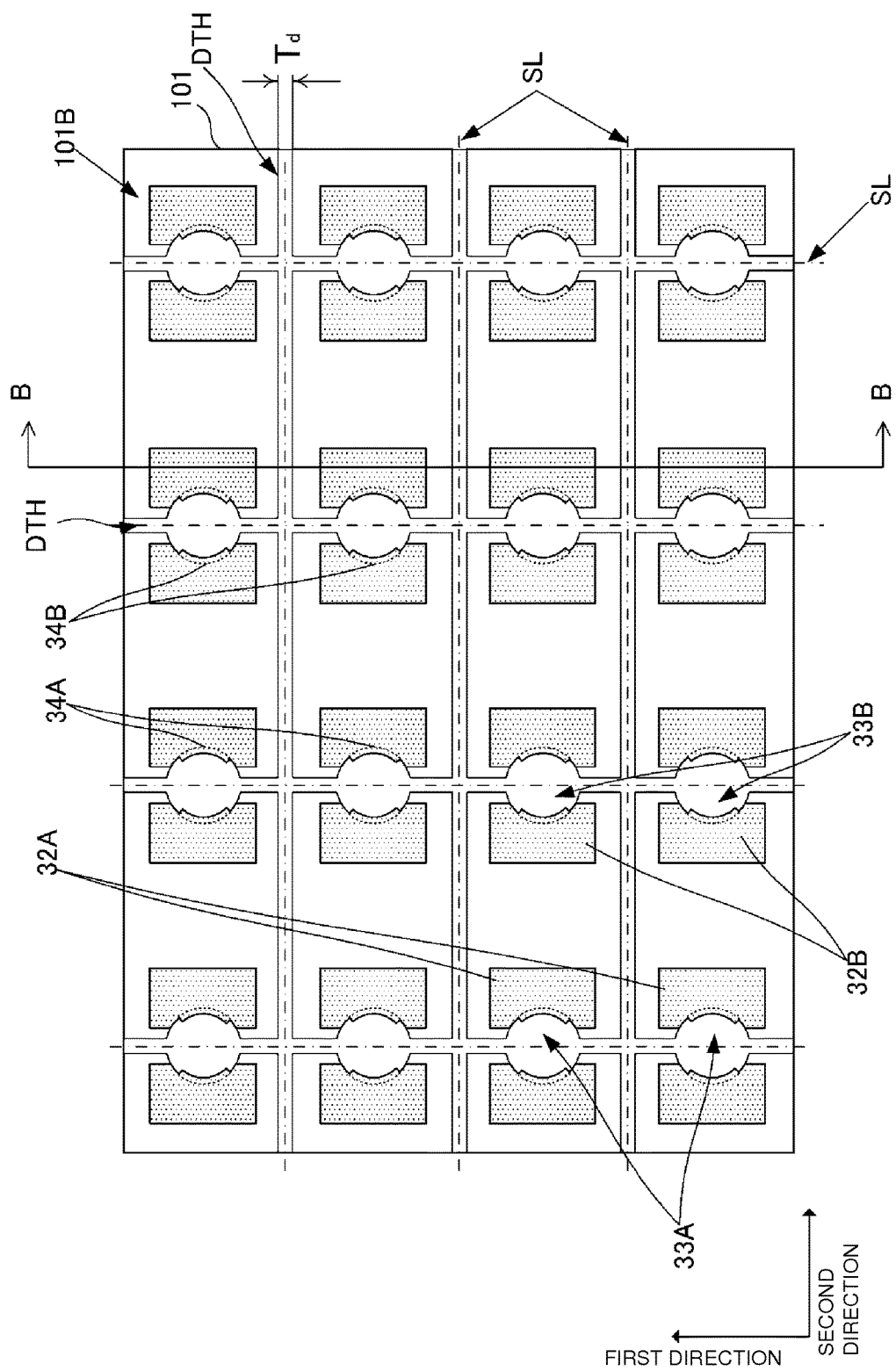
FIG. 7 is a plan view of the insulating substrate with grooves disposed in its back side.
Figure 8:
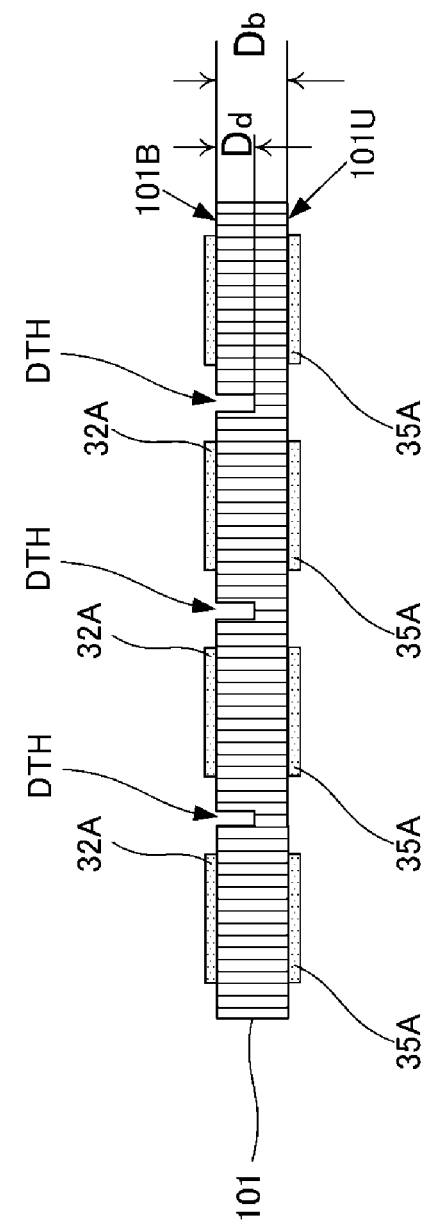
FIG. 8 is a cross-sectional view taken along the line B-B in FIG. 7 and illustrates the insulating substrate with the grooves disposed in its back side.
Figure 10:
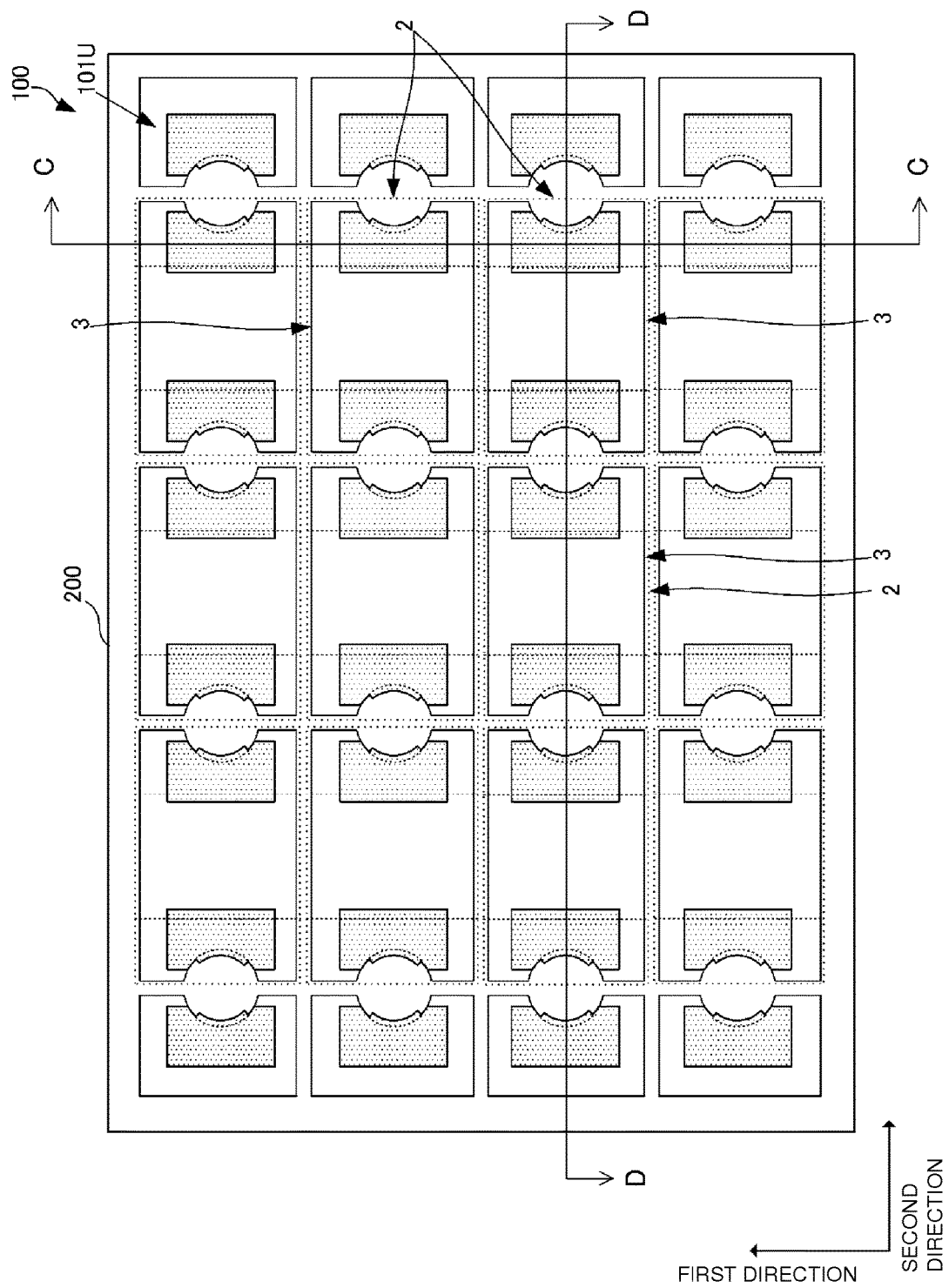
FIG. 10 is a plan view of an assembly of substrate-type terminals on which the multilayer capacitors are mounted.
Figure 11A:
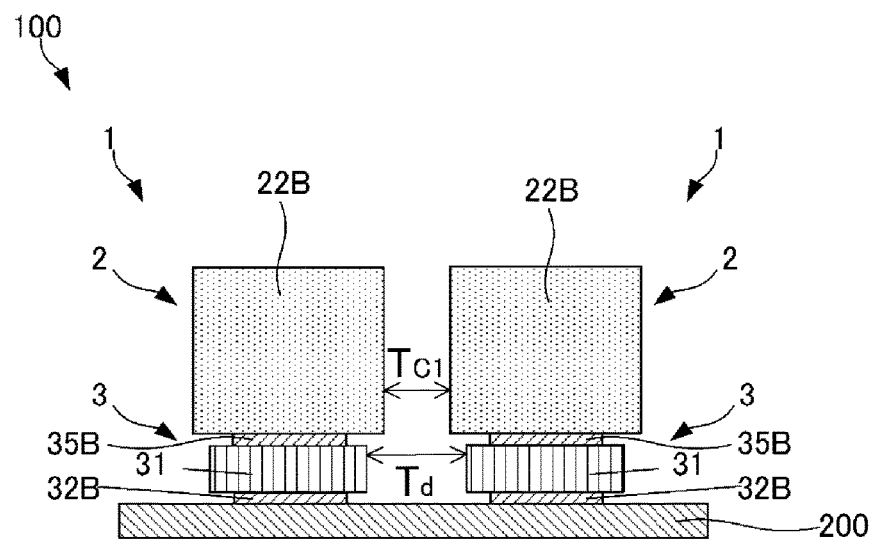
FIG. 11A illustrates a portion of a cross section of the assembly taken along the line C-C in FIG. 10.
Figure 11B:
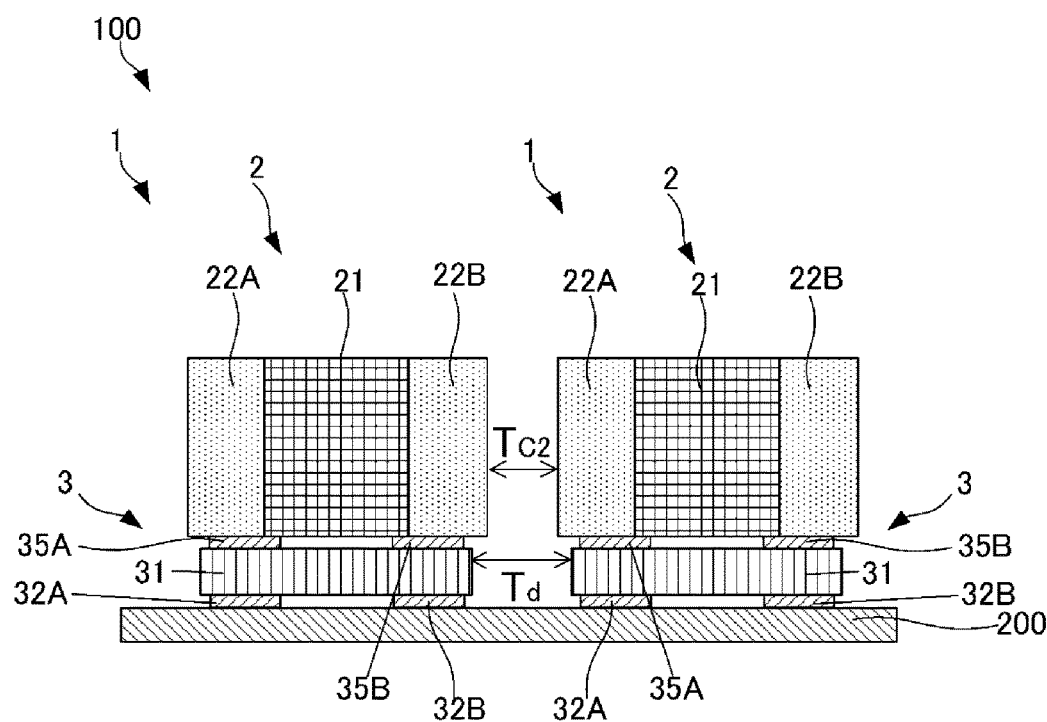
FIG. 11B illustrates a portion of a cross section of the assembly taken along the line D-D in FIG. 10.

Next, a method of producing the electronic components 1 is according to the first preferred embodiment is described with reference to FIGS. 2 to 11B. FIG. 2 is a flowchart that illustrates processes in the method of producing the electronic components 1 according to the first preferred embodiment. FIG. 3 is a plan view of an insulating substrate 101 with a plurality of electrodes 102 disposed thereon. FIG. 4 is a plan view of the insulating substrate 101 with a plurality of holes 103 disposed therein. FIG. 5 is a cross-sectional view taken along the line A-A in FIG. 4 and illustrates the insulating substrate 101 with the plurality of connection electrodes 34A and 34B disposed thereon. FIG. 6 is a plan view of the insulating substrate 101 for describing separation lines SL. FIG. 7 is a plan view of the insulating substrate 101 with grooves disposed in a back side 101B. FIG. 8 is a cross-sectional view taken along the line B-B in FIG. 7 and illustrates the insulating substrate 101 with the grooves disposed in the back side 101B. FIG. 9A is a side view of the insulating substrate 101 with an adhesive sheet 200 attached on the back side 101B. FIG. 9B is a side view of the insulating substrate 101 inverted and cut from a front side 101U. FIG. 10 is a plan view of an assembly 100 of substrate-type terminals 3 on which the multilayer capacitors 2 are mounted. FIG. 11A illustrates a portion of a cross section of the assembly 100 taken along the line C-C in FIG. 10. FIG. 11B illustrates a portion of a cross section of the assembly 100 taken along the line D-D in FIG. 10. In FIG. 10, the multilayer capacitors 2 are indicated by dotted lines for the sake of description.

First, as a preparing process, the insulating substrate 101 to become the assembly 100 including the plurality of substrate-type terminals 3 is prepared (S10). The insulating substrate 101 preferably has a thickness of about 0.05 mm to about 0.4 mm and preferably has a rectangular or substantially rectangular plane shape, for example. The insulating substrate 101 is made of an insulating resin, an inorganic material, or a material containing both. For example, the insulating substrate 101 may be a glass epoxy substrate in which a glass fabric is embedded with an epoxy resin. The mode of the insulating substrate 101 is not limited to the above-described one. For example, the mode may be used in which the insulating substrate 101 is formed by being embedded with a resin other than the epoxy resin, or the mode may be used in which it is made of another inorganic material. For example, a ceramic substrate may be used as the insulating substrate 101.

Next, as an electrode forming process, the plurality of electrodes 102 are formed on a front side 101U and a back side 101B of the insulating substrate 101 (S20). The electrodes 102 on the front side 101U and the electrodes 102 on the back side 101B are formed along desired electrode patterns. As illustrated in FIG. 3, the plurality of electrodes 102 are arranged in a matrix extending first and second directions perpendicular or substantially perpendicular to each other. The electrodes 102 are spaced apart at predetermined intervals in the first and second directions. The predetermined intervals are determined in consideration of the arrangement of the separation lines SL and the thickness $T_d$ of a dicing blade described below. The electrode pattern defined by the plurality of electrodes 102 may be formed with, for example, copper plating formed by electrolysis or electroless plating.

The electrode patterns on both sides of the insulating substrate 101 preferably have the same shape or substantially the same shape. That is, the shape and the arrangement of the electrodes 102 on the back side 101B are preferably the same or substantially the same as those on the front side 101U. However, the electrodes 102 on the back side 101B may have any shape in which they at least partly overlap the electrodes 102 on the front side 101U as seen from the normal direction of the first principal surface of the insulating substrate 101 to enable them to be connected with the electrodes 102 on the front side 101U through the connection electrodes 34A and 34B described below.

When the plurality of electrodes 102 are formed on both sides of the insulating substrate 101 (S20), as a connection electrode forming process, the plurality of holes 103 are formed, and the connection electrodes 34A and 34B are formed by the application of plating on a portion of the holes 103 (S30). As illustrated in FIG. 4, each of the holes 103 is formed such that the electrodes 102 adjacent in the second direction is cut by a single circle. The hole 103 extends through the electrodes 102 and also extends from the front side 101U to the back side 101B through the insulating substrate 101. The hole 103 is preferably formed with a laser or needle, for example. The electrodes 102 on the front side 101U are configured to define the electrodes 35A and 35B configured to be connected to the device by being cut by the hole 103. The electrodes 102 on the back side 101B are configured to define the electrodes 32A and 32B for external connection by being cut by the hole 103.

A cross section of the insulating substrate 101 exposed by the hole 103 (side wall defined by the hole 103) is subjected to plating of, for example, copper at two locations. As illustrated in FIG. 4, the plating is applied on the hole 103 at locations spaced apart in the second direction as seen from the normal direction of the first principal surface of the insulating substrate 101. As illustrated in FIG. 5, the plating is formed so as to be connected from the front side 101U to the back side 101B of the insulating substrate 101.

As illustrated in FIGS. 4 and 5, the portions of the hole 103 on which the plating is applied become the connection electrodes 34A and 34B. The locations and arrangement of the connection electrodes 34A and 34B are determined in consideration of the arrangement of the separation lines SL and the thickness $T_d$ of the dicing blade described below.

When the hole 103 is formed and the connection electrodes 34A and 34B are formed (S30), as a groove forming process, grooves DTH are formed in the back side 101B of the insulating substrate 101 along the separation lines SL (S40).

The separation lines SL are lines for use in dividing the insulating substrate 101 into the plurality of substrate-type terminals 3. As illustrated in FIG. 6, the separation lines SL are set in a matrix. The separation lines SL are set while avoiding the electrodes 35A and 35B configured to be connected to the devices and the connection electrodes 34A and 34B as seen from the normal direction of the front side 101U of the insulating substrate 101. In other words, the separation lines SL are set so as not to pass through the electrodes 35A and 35B configured to be connected to the devices and the connection electrodes 34A and 34B as seen from the normal direction of the front side 101U of the insulating substrate 101.

More specifically, each of the separation lines SL extending along the first direction may be set so as to pass through, for example, a center or approximate center of the hole 103 and so as not to overlap the connection electrodes 34A and 34B. Each of the separation lines SL extending along the second direction may be set so as to pass through, for example, an intermediate or substantially intermediate location between the electrodes 35A and 35B configured to be connected to the devices adjacent in the first direction. The separation lines SL are designed lines, and it is not necessary to actually provide them to the insulating substrate 101.

The grooves DTH are formed by dicer processing on the back side 101B of the insulating substrate 101. In dicer processing, a rotating dicing blade 900 presses the insulating substrate 101 from the back side 101B toward the front side 101U. In dicer processing, the depth $D_d$ of each of the grooves DTH is adjusted so as not to cut completely through the insulating substrate 101. More specifically, as illustrated in FIG. 8, the depth $D_d$ of the groove DTH is adjusted such that it is smaller than the thickness $D_b$ of the insulating substrate 101. The width of the groove DTH is substantially the same as the thickness $T_d$ of the edge of the dicing blade 900, as illustrated in FIG. 7.

As described above, in the groove forming process, the grooves DTH are formed such that no grooves are formed in the electrodes 32A and 32B for external connection and the connection electrodes 34A and 34B. Accordingly, electrodes in which burrs would be easily caused by scraping are not cut.

When the grooves DTH are formed (S40), as an inverting process, the adhesive sheet 200 is attached on the back side 101B of the insulating substrate 101, and the surface of the insulating substrate 101 is inverted (S50).

The adhesive sheet 200 is a flat member including an adhesive surface. The adhesive sheet 200 has a plane shape larger than that of the insulating substrate 101. The adhesive sheet 200 is a release foam sheet made of an adhesive resin, and its adhesion is weakened by heat. Although in FIG. 9A, the adhesive sheet 200 is not in contact with the back side 101B of the insulating substrate, the back side 101B of the insulating substrate 101 may preferably be in contact with the adhesive sheet 200.

Because the insulating substrate 101 is supported by the plane of the adhesive sheet 200, even when a force is exerted during inverting, the insulating substrate 101 does not easily splinter.

Next, when the surface of the insulating substrate 101 is inverted (S50), as a cutting process, the insulating substrate 101 is cut from the front side 101U along the separation lines SL (S60). Then the insulating substrate 101 becomes the assembly 100 including the plurality of substrate-type terminals 3.

The cutting process is performed by cutting along the separation lines SL. As illustrated in FIG. 9B, the cutting is performed by dicer processing using the dicing blade 900. In dicer processing, the dicing blade 900 presses the insulating substrate 101 from the front side 101U toward the back side 101B of the insulating substrate 101.

When the dicing blade 900 reaches the groove DTH, the insulating substrate 101 is cut into the assembly 100 including the plurality of substrate-type terminals 3. Because the plurality of the substrate-type terminals 3 are supported by the adhesive sheet 200, they do not fall away into pieces, and the subsequent processes can be performed while the matrix arrangement is maintained.

In the cutting process, the insulating substrate 101 is cut along the separation lines SL, that is, such that the electrodes 35A and 35B configured to be connected to the device and the connection electrodes 34A and 34B are not cut. Accordingly, in the cutting process, electrodes in which burrs would be easily caused by cutting are not cut.

When the adhesive sheet 200 preferably has adhesion on both sides, the insulating substrate 101 is prevented from being displaced in dicer processing.

The method of producing substrate-type terminals 3 ends in the process illustrated at step S60. When the processes described below are subsequently performed, the electronic components 1 each including the multilayer capacitor 2 on the substrate-type terminal 3 are produced.

When the insulating substrate 101 is cut (S60), as a bonding-agent printing process, the solder bonding agent is printed on the surface of each of the electrodes 35A and 35B configured to be connected to the devices (S70). The solder bonding agent is a conductive material containing tin. The solder bonding agent is printed by screen printing. However, the solder bonding agent may also be printed on the surface of each of the electrodes 35A and 35B configured to be connected to the devices by methods other than screen printing.

Because the front side 101U of the insulating substrate 101 is exposed by the inverting process, it is not necessary to invert the surface of the insulating substrate 101, and the bonding-agent printing process is performed smoothly.

When the solder bonding agent is printed (S70), as a heating process, the multilayer capacitor 2 is mounted on each of the substrate-type terminals 3, and the assembly 100 is placed into a reflow furnace and is heated (S80). Performing the bonding-agent printing process at step S70 and the heating process at step S80 corresponds to a mounting process of mounting the multilayer capacitor 2 on the substrate-type terminal 3.

As illustrated in FIG. 10, the multilayer capacitors 2 are mounted such that the outer electrodes 22A and 22B are connected to the electrodes 35A and 35B configured to be connected to the devices, and they are heated. Then the solder bonding agent on the surface of each of the electrodes 35A and 35B configured to be connected to the devices are melted, and afterward, it is solidified by being cooled. As a result, the outer electrodes 22A and 22B are electrically and mechanically joined to the electrodes 35A and 35B configured to be connected to the devices.

Lastly, as an extracting process, the plurality of substrate-type terminals 3 are extracted from the assembly 100 (S90). At this time, because the adhesion of the adhesive sheet 200 is weakened by heating in the reflow furnace, the substrate-type terminals 3 are easily and readily peeled from the adhesive sheet 200.

As described above, in the method of producing the electronic components 1 according to the first preferred embodiment, the insulating substrate 101 is scraped and cut such that the electrodes are not scraped or cut. Accordingly, in the method of producing the electronic components 1 according to the present preferred embodiment, electrodes in which burrs are easily caused by scraping or cutting are not scraped or cut, and thus it is not necessary to apply a resist. Needless to say, a portion of the multilayer capacitor 2 does not ride on a resist, or the location of implementing the multilayer capacitor 2 is not displaced.

In the groove forming process and the cutting process, the dicing blade 900 penetrates through the insulating substrate 101. Accordingly, even if the dicing blade 900 cuts an electrode disposed on a processing surface (surface against which the dicing blade 900 is pressed) because of errors in processing accuracy or the like, a burr extending from the processing surface toward the inside of the insulating substrate 101 does not protrude through the surface opposite to the processing surface to the outside of the substrate.

In the method of producing the electronic components 1 according to the first preferred embodiment, the multilayer capacitor 2 is mounted after the insulating substrate 101 is divided. Accordingly, the multilayer capacitor 2 is not detached from the substrate-type terminal 3 or the connection between the multilayer capacitor 2 and the substrate-type terminal 3 is not split by the impact occurring in dividing. In particular, even if the distance between the cross section of the groove DTH (side surface of the substrate body 31) and each of the electrodes 35A and 35B configured to be connected to the devices preferably is about 1 mm or less, for example, and thus the substrate body 31 is susceptible to impact, the method of producing the electronic components 1 according to the first preferred embodiment prevents detachment of the multilayer capacitor 2 and splitting of the connection between the multilayer capacitor 2 and the substrate-type terminal 3.

In the method of producing the electronic components 1, because the substrate-type terminals 3 are spaced apart in the assembly 100, the multilayer capacitors 2 each having a plane shape larger than that of each of the substrate-type terminals 3 can be mounted.

More specifically, in the assembly 100, as illustrated in the cross-sectional view of FIG. 11A taken along the line C-C in FIG. 10, the substrate-type terminals 3 are spaced apart by the same or substantially the same distance as the thickness $T_d$ of the edge of the dicing blade 900 in the first direction in FIG. 10. The multilayer capacitors 2 are spaced apart by a distance $T_{c1}$ in the first direction in FIG. 10. The distance $T_{c1}$ is shorter than the distance $T_d$. As illustrated in the cross-sectional view of FIG. 11B taken along the line D-D in FIG. 10, the substrate-type terminals 3 are spaced apart by the same or substantially the same distance as the thickness $T_d$ of the edge of the dicing blade 900 in the second direction in FIG. 10. The multilayer capacitors 2 are spaced apart by a distance $T_{c2}$ in the second direction in FIG. 10. The distance $T_{c2}$ is shorter than the distance $T_d$.

For example, the distances $T_{c1}$ and $T_{c2}$ may be preferably set at about 200 μm, and the distance $T_d$ may be set at about 300 μm. The distances $T_{c1}$ and $T_{c2}$ are not limited to about 200 μm, and they may preferably be about 150 μm or more, for example. The distance $T_d$ may preferably be set at a value longer by about 50 μm or more than each of the distances $T_{c1}$ and $T_{c2}$, for example.

That is, the substrate-type terminal 3 has a plane shape smaller than that of the multilayer capacitor 2. Such a shape makes the substrate-type terminal 3 less susceptible to external impact. As a result, the multilayer capacitor 2 is not easily detached from the substrate-type terminal 3.

If it is necessary to further increase the distance $T_d$ in order to mount the multilayer capacitor 2, that is, if it is necessary to widen the intervals of the substrate-type terminals 3, the adhesive sheet 200 may be extended.

In the above-described example, the release foam tape whose adhesive is weakened by heat is used as the adhesive sheet 200. Adhesive tape other than the release foam tape may also be used as the adhesive sheet 200.

In the above-described example, the substrate-type terminals 3 in the assembly 100 are spaced apart using the thickness $T_d$ of the edge of the dicing blade. Modes other than dicer processing may also be used. For example, the mode may also be used in which after the insulating substrate 101 is cut by a cutter blade pressed down, the substrate-type terminals 3 are arranged at predetermined intervals using a production tool.

In the above-described example, the multilayer capacitor 2 is mounted on the substrate-type terminal 3 in the electronic component 1. Devices other than the multilayer capacitor 2, such as an inductor or other devices, may also be mounted.

Second Preferred Embodiment

Figure 12:
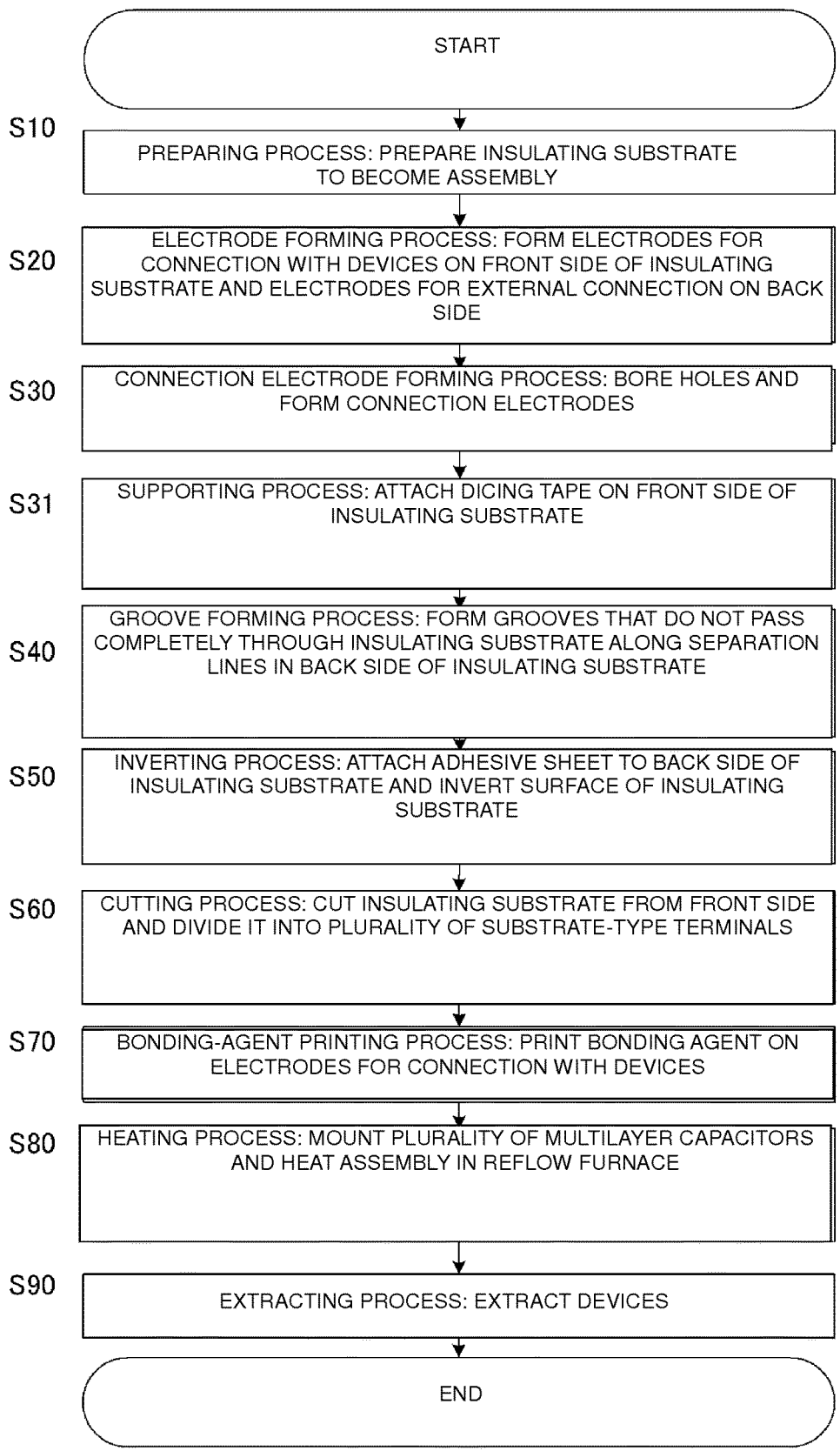
FIG. 12 is a flowchart that illustrates processes in a method of producing electronic components according to a second preferred embodiment of the present invention.

Next, a method of producing the electronic components 1 according to a second preferred embodiment of the present invention is described with reference to FIG. 12. FIG. 12 is a flowchart that illustrates processes in the method of producing the electronic components 1 according to the second preferred embodiment.

The method of producing the electronic components 1 according to the second preferred embodiment differs from that according to the first preferred embodiment illustrated in FIG. 2 in that a supporting process at step S31 follows the connection electrode forming process illustrated at step S30. That is, the method of producing the electronic components 1 according to the second preferred embodiment performs the groove forming process at step S40 after dicing tape 300 is attached on the front side 101U of the insulating substrate 101 and the surface of the insulating substrate 101 is inverted. In the following description, the same processes as in the method of producing the electronic components 1 according to the first preferred embodiment are not described.

At step S31, the dicing tape 300 is made to come into contact with and be attached to the front side 101U of the insulating substrate 101.

The shape and material of the dicing tape 300 may be the same or substantially the same as those of the adhesive sheet 200, for example. The dicing tape 300 is adhesive at both sides.

After the surface of the insulating substrate 101 is inverted while the dicing tape 300 is attached, grooves are formed in the back side 101B of the insulating substrate 101 (S40).

Because the insulating substrate 101 is supported by the plane of the dicing tape 300 while it is inverted, even when a force is exerted on the plane of the insulating substrate 101 in inverting, the insulating substrate 101 does not easily splinter.

The dicing tape 300 fixes the insulating substrate 101 at a dicer table in the groove forming process (S40), thus facilitating dicer processing.

The dicing tape 300 is peeled off after the groove forming process (S40) and before the cutting process (S50).

Third Preferred Embodiment

Figure 13:
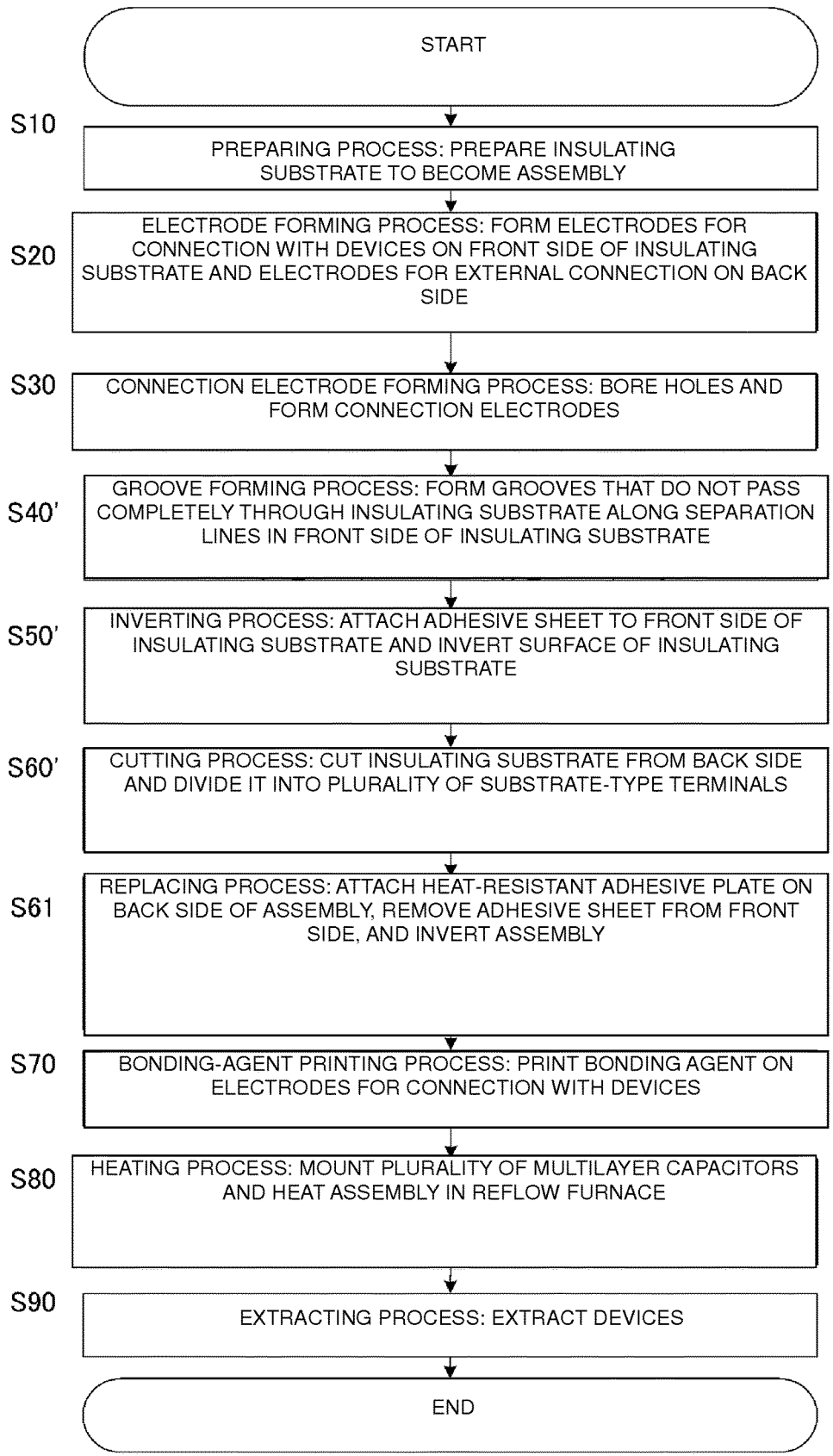
FIG. 13 is a flowchart that illustrates processes in a method of producing electronic components according to a third preferred embodiment of the present invention.

Next, a method of producing the electronic components 1 according to a third preferred embodiment of the present invention is described with reference to FIGS. 13 to 14B. FIG. 13 is a flowchart that illustrates processes in the method of producing the electronic components 1 according to the third preferred embodiment. FIG. 14A is a side view of the assembly 100 with a heat-resistant adhesive plate 400 attached on the back side. FIG. 14B is a side view of the assembly 100 and the adhesive sheet 200 removed from the front side.

The method of producing the electronic components 1 according to the third preferred embodiment differs from that according to the first preferred embodiment in that the processes at steps S40', S50', and S60' are performed instead of the processes at steps S40, S50, and S60 and afterward a transferring process at step S61 is performed. In the following description, the same processes as in the method of producing the electronic components 1 according to the first preferred embodiment are not described.

That is, in the method of producing the electronic components 1 according to the third preferred embodiment, the surface in which the grooves DTH are formed, the surface on which the adhesive sheet 200 is attached, and the surface on which the cutting process is performed are opposite to those in the method of producing the electronic components 1 according to the first preferred embodiment, and before the multilayer capacitor 2 is mounted on the substrate-type terminal 3, the assembly 100 is transferred from the adhesive sheet 200 to the heat-resistant adhesive plate 400 (corresponding to a second support member) and is supported by the heat-resistant adhesive plate 400.

In the method of producing the electronic components 1 according to the third preferred embodiment, as illustrated in FIG. 14A, after the insulating substrate 101 is cut, the heat-resistant adhesive plate 400 having adhesion not easily weakened by heat is attached to the back side (surface on which the electrodes 32A and 32B for external connection are disposed) of the assembly 100 (S61). Then as illustrated in FIG. 14B, the adhesive sheet 200 is peeled from the assembly 100, and the surface of the assembly 100 is inverted (S61). The adhesive sheet 200 is peeled off after its adhesion is weakened by heating or ultraviolet radiation. After the adhesive sheet 200 is peeled off, the front side (surface on which the electrodes 35A and 35B configured to be connected to the devices are disposed) of the assembly 100 is exposed, and a device mounting step of mounting the multilayer capacitors 2 on the electrodes 35A and 35B configured to be connected to the devices is allowed to be performed.

Because the heat-resistant adhesive plate 400 supports the assembly 100, even when the assembly 100 is heated in the reflow furnace, the plurality of substrate-type terminals 3 do not easily fall to pieces. The heat-resistant adhesive plate 400 is not used in dicer processing in the cutting process and thus is not damaged by the dicer processing. Accordingly, the heat-resistant adhesive plate 400 is reusable, and the method of producing the electronic components 1 according to the third preferred embodiment is economical.

At step S61, the adhesive sheet 200 having adhesion weaker than that of the heat-resistant adhesive plate 400 may be used, and the adhesive sheet 200 may be peeled from the assembly 100 without being heated or radiated with ultraviolet rays.

The supporting process in the method of producing the electronic components 1 according to the second preferred embodiment may be performed before the groove forming process. In that case, the adhesive sheet 200 is attached on the back side 101B of the insulating substrate 101.

Next, the mode in which the insulating substrate 101 is cut such that electrodes are not cut to prevent the occurrence of burrs in cutting is used in the above-described examples. Because burrs do not easily occur even if an electrode is cut in the method of producing the electronic components 1, when an electrode is cut in the way described below, the substrate-type terminals 3 and the electronic components 1 are also produced.

Figure 15A:
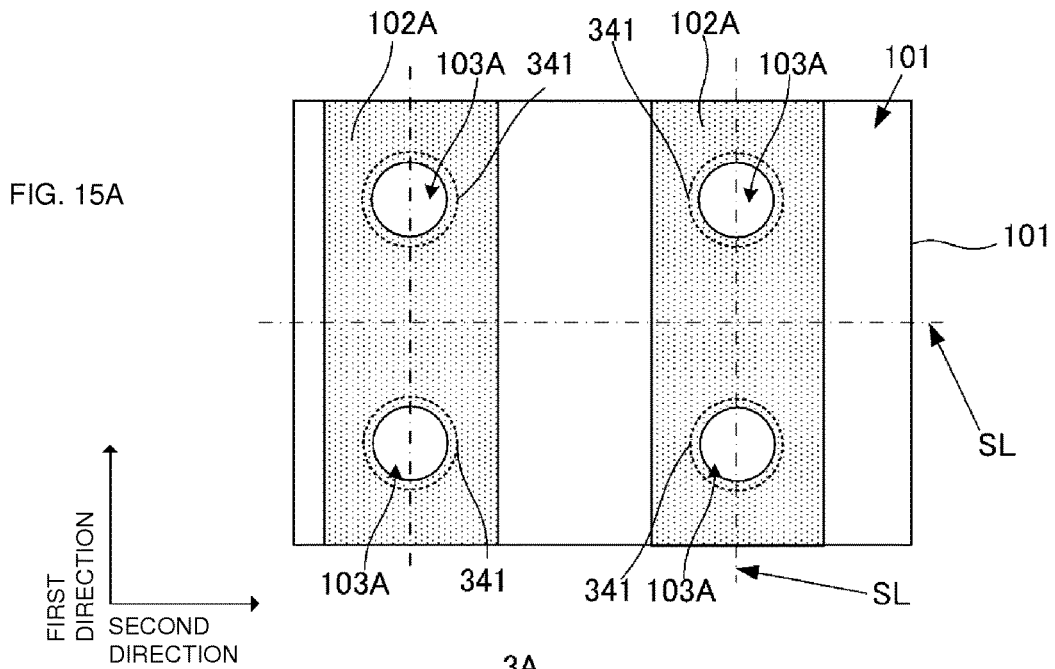
FIG. 15A illustrates a portion of a plan view of the insulating substrate where a plurality of electrodes, a plurality of holes, and a plurality of connection electrodes are disposed.
Figure 15B:
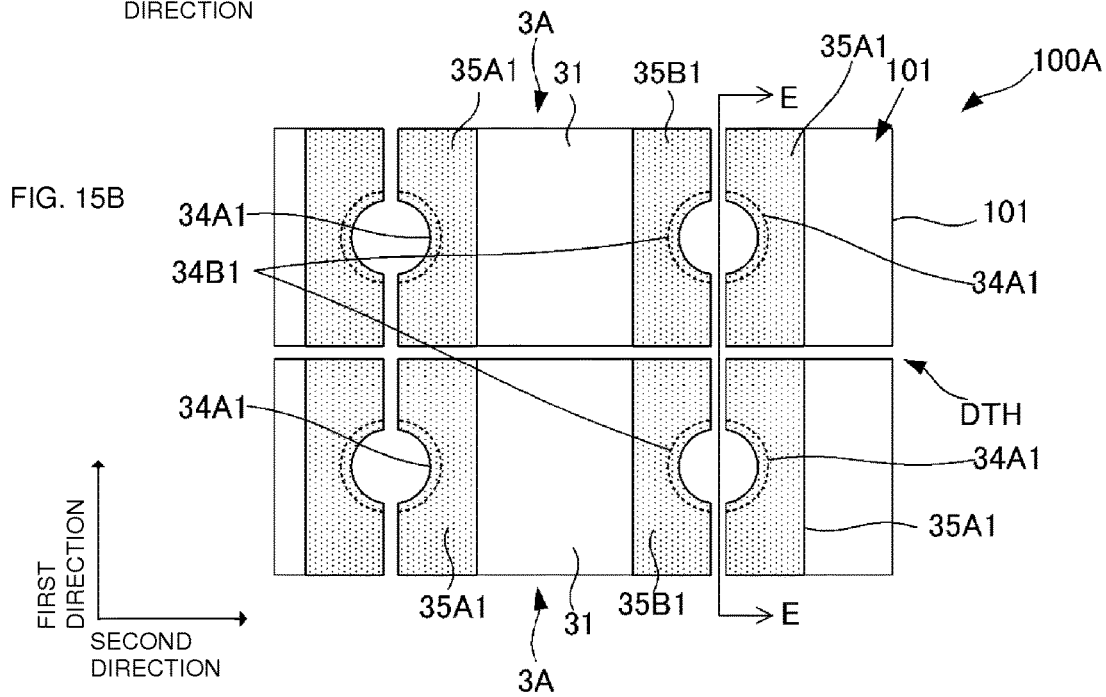
FIG. 15B illustrates a portion of a plan view of an assembly after the cutting process.
Figure 15C:
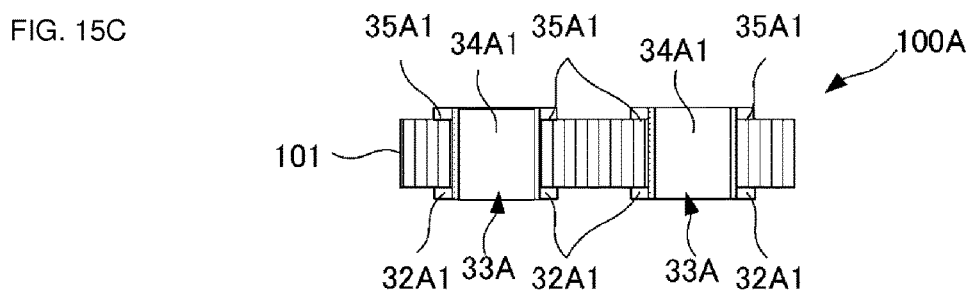
FIG. 15C is a cross-sectional view taken along the line E-E in FIG. 15B.

FIGS. 15A to 15C are illustrations for describing a cutting process according to a variation of a preferred embodiment of the present invention. FIG. 15A illustrates a portion of a plan view of the insulating substrate 101 where a plurality of electrodes 102A, a plurality of holes 103A, and a plurality of connection electrodes 341 are disposed. FIG. 15B illustrates a portion of a plan view of an assembly 100A after the cutting process. FIG. 15C is a cross-sectional view taken along the line E-E in FIG. 15B.

As illustrated in FIG. 15A, each of the electrodes 102A has an elongated shape extending in the first direction on the front side 101U of the insulating substrate 101. The electrodes 102A are spaced apart at desired intervals in the second direction. The separation lines SL extend through the electrodes 102A along the first and second directions. As illustrated in FIG. 15B, the electrodes 35A1 and 35B1 configured to be connected to the devices are formed by cutting the insulating substrate 101 along the separation lines SL.

The plurality of electrodes 102A having the same or substantially the same pattern as that on the front side 101U are formed on the back side 101B of the insulating substrate 101. That is, the electrodes 32A1 and 32B1 for external connection are formed by cutting the electrodes 102A on the back side 101B of the insulating substrate 101 in the groove forming process.

In the cutting process according to the variation, after the insulating substrate 101 is cut, each of the connection electrodes 341 is formed by the application of plating on the entire surface of the side wall defined by the hole 103A. When the insulating substrate 101 is cut along the separation lines SL, as illustrated in FIGS. 15B and 15C, the connection electrodes 34A1 and 34B1 are formed on the entire surface of the cross section defined by the indentations 33A and 33B and the substrate body 31.

In the cutting process according to the variation, the electrodes 102A and the connection electrodes 341 are cut. After the grooves DTH are formed in the back side 101B of the insulating substrate 101, the insulating substrate 101 is cut along the separation lines SL from the front side 101U. Accordingly, in the cutting process according to the variation, even if the electrodes are cut, burrs do not protrude outside the insulating substrate 101. Accordingly, burrs raise no problem when the multilayer capacitor 2 is implemented and when the electronic component 1 with the multilayer capacitor 2 implemented thereon is implemented on a circuit board through the electrodes 32A1 and 32B1 for external connection. In addition, it is not necessary to apply a resist.

Figure 16A:
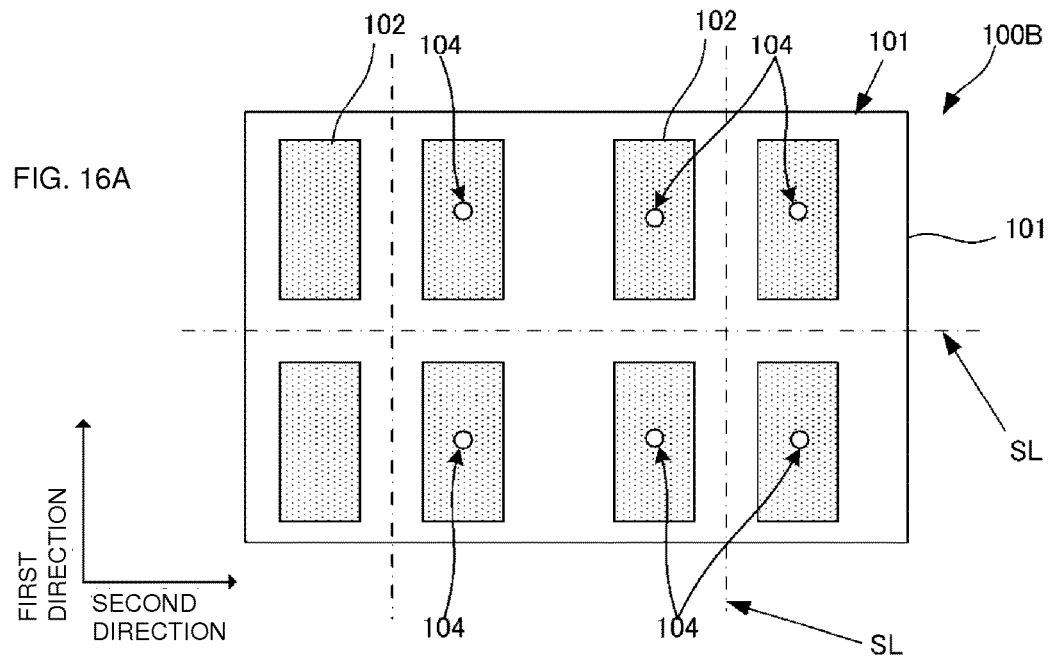
FIG. 16A is a plan view of the insulating substrate where the plurality of electrodes and the plurality of holes are disposed.
Figure 16B:
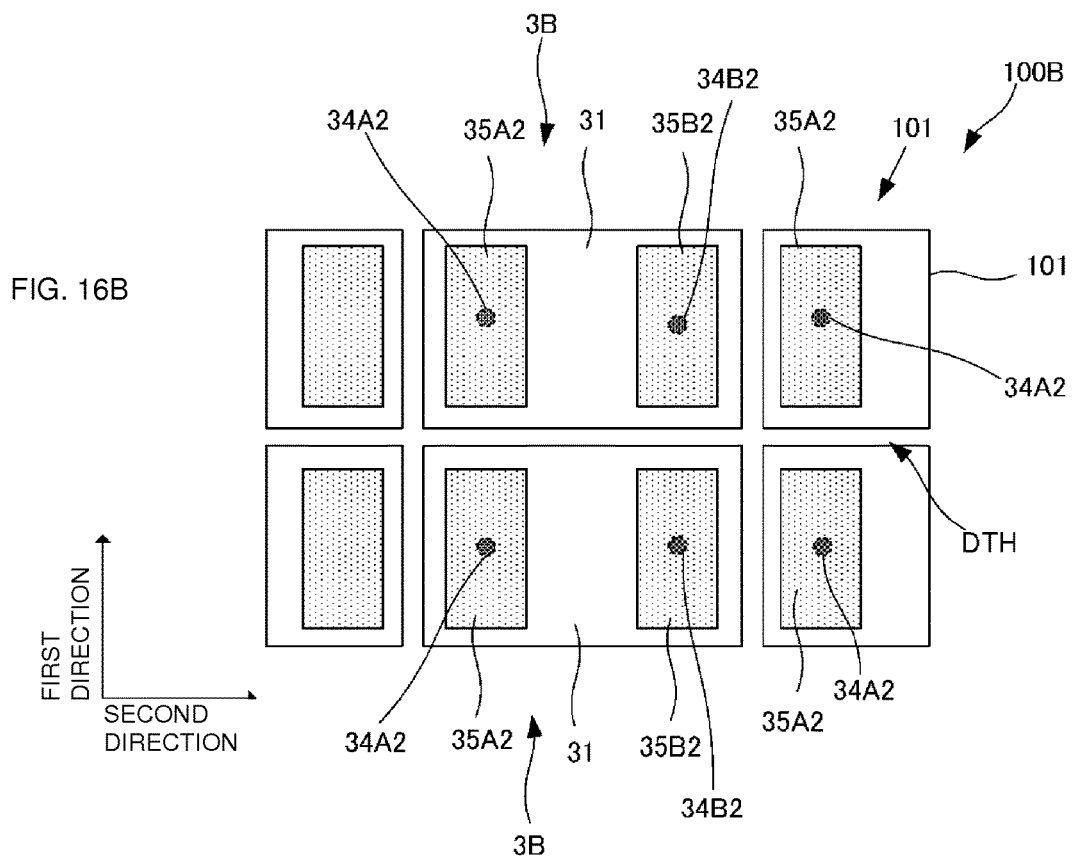
FIG. 16B is a plan view of an assembly after the cutting process.

Next, a connection electrode forming process according to a variation is described with reference to FIGS. 16A and 16B. FIG. 16A is a plan view of the insulating substrate 101 where the plurality of electrodes 102 and the plurality of holes 104 are disposed. FIG. 16B is a plan view of an assembly 100B after the cutting process.

The connection electrode forming process according to the variation differs from that illustrated in FIGS. 4 and 5 mainly in that connection electrodes 34A2 and 34B2 are formed by producing the plurality of holes 104 and filling them with conductive paste (for example, containing silver as the main component). That is, the connection electrodes 34A2 and 34B2 are formed as vias configured to connect the electrodes 35A2 and 35B2 configured to be connected to the device and the electrodes 32A2 and 32B2 for external connection.

As illustrated in FIG. 16A, the holes 104 extend from the front side 101U to the back side 101B through the insulating substrate 101 in the respective electrodes 102. The holes 104 are filled with conductive paste. The conductive paste is sintered by the heating process, and they becomes the connection electrodes 34A2 and 34B2. The connection electrodes 34A2 and 34B2 electrically connect electrodes 35A2 and 35B2 configured to be connected to the device and electrodes 32A2 and 32B2 for external connection.

The mode may also be used in which the connection electrodes 34A2 and 34B2 are not formed as vias but preferably are formed from through-hole plating on side walls of the holes 104.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A method of producing electronic components each including a substrate-type terminal and a device connected to the substrate-type terminal, the substrate-type terminal including a substrate body including a first principal surface and a second principal surface opposite to each other and including an electrode configured to be connected to the device on the first principal surface, each of the first and second principal surfaces having a rectangular shape extending in first and second directions perpendicular to each other, the device being disposed on the first principal surface, the method comprising:

a groove forming step of forming grooves in a substrate from a principal surface of the substrate such that the substrate is divided into the plurality of substrate-type terminals, the principal surface of the substrate being the first principal surface or the second principal surface of the substrate body, each of the grooves having a depth less than a thickness of the substrate;

a cutting step of cutting the substrate from another principal surface opposite to the principal surface of the substrate such that the grooves penetrate through the substrate in a thickness direction thereof; and a mounting step of mounting the device on the first principal surface of the substrate body of each of the substrate-type terminals obtained by the cutting step; wherein at least two of the substrate-type terminals are directly adjacent to one another in the first direction, and at least two of the devices are directly adjacent to one another in the first direction;

in the cutting step, the substrate is cut such that the at least two of the substrate-type terminals directly adjacent to one another in the first direction are spaced apart at first predetermined intervals; and each of the first predetermined intervals is greater than each interval between the at least two of the devices directly adjacent to one another in the first direction mounted on the substrate-type terminals.

2. The method of producing the electronic components according to claim 1, wherein in the cutting step, a first support member is attached on the principal surface of the substrate, the substrate is supported using the first support member, the surface of the substrate is inverted, and the substrate is cut from the another principal surface of the substrate.

3. The method of producing electronic components according to claim 1, wherein
   at least two of the substrate-type terminals are adjacent to one another in the second direction, and at least two of the devices are adjacent to one another in the second direction;
   in the cutting step, the substrate is cut such that the at least two of the substrate-type terminals adjacent to one another in the second direction are spaced apart at second predetermined intervals; and
   each of the second predetermined intervals is greater than each interval between the at least two of the devices adjacent to one another in the second direction mounted on the substrate-type terminals.

4. The method of producing the electronic components according to claim 1, wherein each of the grooves extends between the electrodes configured to be connected to the at least two of the devices adjacent to one another in the first direction.

5. The method of producing the electronic components according to claim 1, wherein
   at least two of the electrodes are spaced apart in the first direction on the another principal surface and provide external connection; and
   each of the grooves extends between the at least two of the electrodes that provide external connection.

6. The method of producing the electronic components according to claim 1, wherein
   the substrate further includes at least two side walls that are each defined by a cylindrical indentation extending through the substrate;
   the electrodes further include electrodes for external connection on the second principal surface and two connection electrodes that are each disposed on a respective one of the at least two side walls; and
   each of the grooves is disposed between the two connection electrodes and extend from the electrodes configured to be connected to the devices on the first principal surface to the electrodes for external connection on the second principal surface, the two connection electrodes connecting the electrodes configured to be connected to the devices and the electrodes for external connection at two locations spaced apart in the second direction.

7. The method of producing the electronic components according to claim 2, wherein the mounting step includes an applying step of applying a solder bonding agent containing tin and a heating step of heating the devices and the substrate-type terminals and melting the solder bonding agent, the method further comprising:
   a transferring step of transferring the plurality of substrate-type terminals from the first support member to a second support member while maintaining an arrangement of the plurality of substrate-type terminals; wherein
   the transferring step is performed between the cutting step and the mounting step.

* * * * *